(12) United States Patent
Huang et al.

(10) Patent No.: US 12,381,163 B2
(45) Date of Patent: *Aug. 5, 2025

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Yu-Chih Huang, Hsinchu (TW); Chih-Hao Chang, Hsinchu County (TW); Po-Chun Lin, Hsinchu (TW); Chun-Ti Lu, Hsinchu (TW); Zheng-Gang Tsai, Hsinchu (TW); Shih-Wei Chen, Hsinchu (TW); Chia-Hung Liu, Hsinchu (TW); Hao-Yi Tsai, Hsinchu (TW); Chung-Shi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/732,662

(22) Filed: Jun. 4, 2024

(65) Prior Publication Data
US 2024/0321780 A1 Sep. 26, 2024

Related U.S. Application Data

(63) Continuation of application No. 17/458,607, filed on Aug. 27, 2021, now Pat. No. 12,002,768.

(51) Int. Cl.
*H01L 23/58* (2006.01)
*H01L 21/56* (2006.01)
(Continued)

(52) U.S. Cl.
CPC .......... *H01L 23/585* (2013.01); *H01L 21/568* (2013.01); *H01L 23/3157* (2013.01);
(Continued)

(58) Field of Classification Search
CPC . H01L 23/585; H01L 23/3157; H01L 21/568; H01L 24/19; H01L 24/25; H01L 2224/2518
See application file for complete search history.

(56) References Cited

U.S. PATENT DOCUMENTS 12,002,768 B2 * 6/2024 Huang ................ H01L 23/3157

* cited by examiner

*Primary Examiner* — Timor Karimy
(74) *Attorney, Agent, or Firm* — JCIPRNET

(57) ABSTRACT

A semiconductor package and a manufacturing method for the semiconductor package are provided. The semiconductor package includes a molded semiconductor device, a first redistribution structure, and conductive vias. The molded semiconductor device comprises a sensor die with a first surface and a second surface opposite the first surface, wherein the sensor die has an input/output region and a sensing region at the first surface. The first redistribution structure is disposed on the first surface of the sensor die, wherein the first redistribution structure covers the input/output region and exposes the sensing region, and the first redistribution structure comprises a conductive layer having a redistribution pattern and a ring structure. The redistribution pattern is electrically connected with the sensor die. The ring structure surrounds the sensing region and is separated from the redistribution pattern, wherein the ring structure is closer to the sensing region than the redistribution pattern. The conductive vias extend through the molded semiconductor device and are electrically connected with the redistribution pattern.

20 Claims, 17 Drawing Sheets

(51) Int. Cl.
  *H01L 23/00*          (2006.01)
  *H01L 23/31*          (2006.01)
(52) U.S. Cl.
  CPC .............. *H01L 24/19* (2013.01); *H01L 24/25* (2013.01); *H01L 2224/2518* (2013.01)

SEMICONDUCTOR PACKAGE AND MANUFACTURING METHOD THEREOF

CROSS-REFERENCE TO RELATED APPLICATION

This application is a continuation application of and claims the priority benefit of a prior application Ser. No. 17/458,607, filed on Aug. 27, 2021. The entirety of the above-mentioned patent application is hereby incorporated by reference herein and made a part of this specification.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is integrated fan-out (InFO) technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
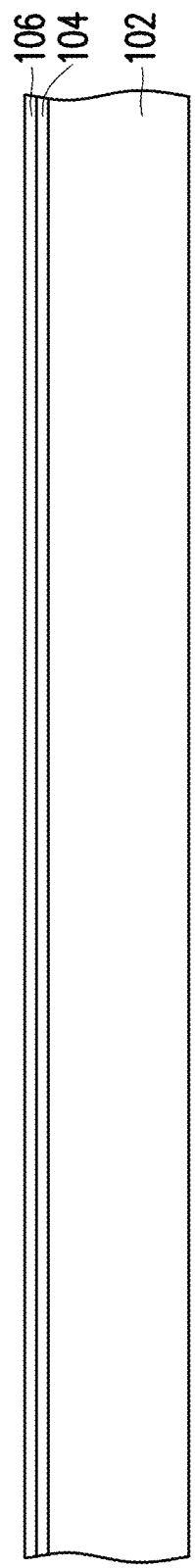
FIG. 1 to FIG. 12 are schematic cross sectional views of various stages in a manufacturing process of a semiconductor package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for case of description to describe similar or different element(s) or feature(s) as illustrated in the figures, and may be used interchangeably depending on the order of the presence or the contexts of the description.

Figure 13:
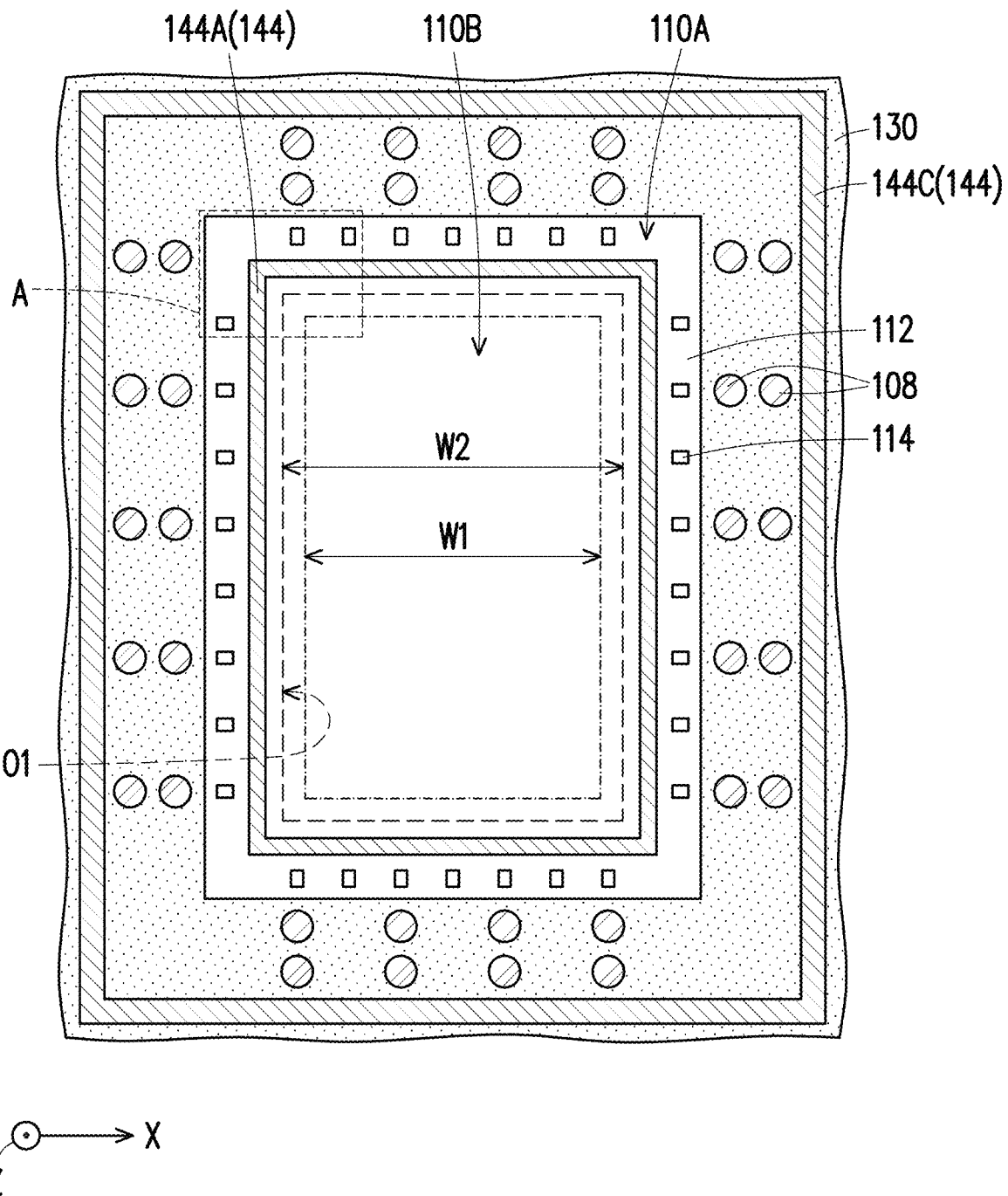
FIG. 13 is a schematic top view illustrating the structure in the stage of FIG. 7 in accordance with some embodiments of the disclosure.
Figure 14:
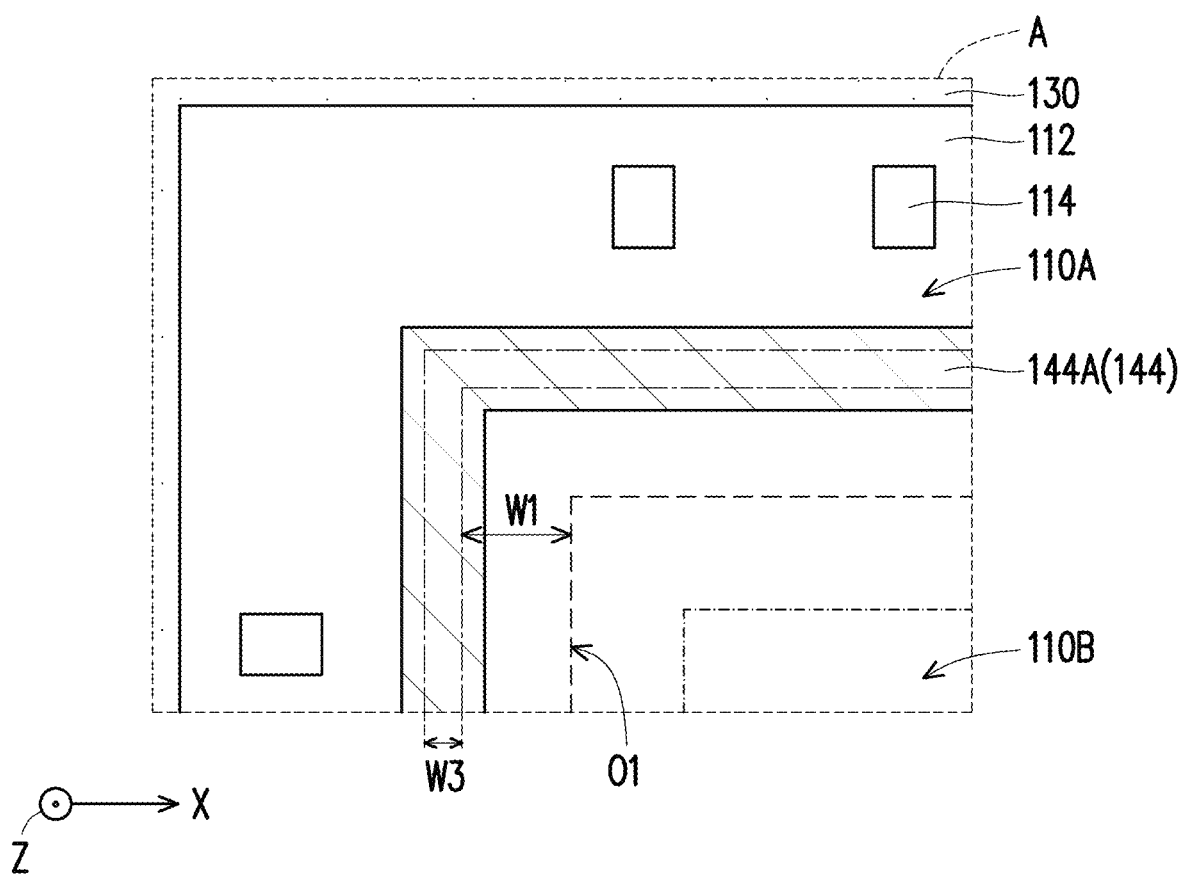
FIG. 14 is a schematic partial enlarge view of the dashed area A outlined in FIG. 13.

FIG. 1 to FIG. 12 are schematic cross sectional views of various stages in a manufacturing process of a semiconductor package 100 in accordance with some embodiments of the disclosure. FIG. 13 is a schematic top view illustrating the structure in the stage of FIG. 7 in accordance with some embodiments of the disclosure. FIG. 14 is a schematic partial enlarge view of the dashed area A outlined in FIG. 13. For simplicity and clarity of illustration, only few elements such as pads and a semiconductor substrate of a sensor die, an encapsulant, conductive vias, a ring structure and a seal ring are shown in the simplified top view of FIG. 13, and these elements are not necessarily in the same plane. In exemplary embodiments, the following semiconductor manufacturing process is part of a wafer level packaging process. In detail, one die is shown to represent plural dies of the wafer, and one single package is shown to represent plural semiconductor packages obtained following the semiconductor manufacturing process. That is to say, a single package region is illustrated in FIG. 1 to FIG. 12, and the semiconductor package 100 (see FIG. 12) is formed in the illustrated package region. The semiconductor package 100 may be an integrated fan-out ("InFO") package.

Referring to FIG. 1, a carrier 102 having a release layer 104 and a dielectric layer 106 formed thereon is provided, wherein the release layer 104 is between the carrier 102 and the dielectric layer 106. The carrier 102 may be a glass substrate, a ceramic substrate, or any suitable substrate for carrying a semiconductor wafer or a reconstituted wafer (e.g., a molded semiconductor device MD) formed subsequently. The carrier 102 may be a wafer, such that multiple packages can be formed on the carrier 102 simultaneously.

The release layer 104 may be formed of a polymer-based material, which may be removed along with the carrier 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier 102, or may be the like. The illustrated top surface of the release layer 104, which is opposite to the illustrated bottom surface contacting the carrier 102, may be leveled and may have a high degree of planarity, but the disclosure is not limited thereto.

The dielectric layer 106 is, for example, polymer such as polyimide, benzocyclobutene (BCB), polybenzoxazole (PBO), or the like. In some alternative embodiments, the dielectric layer 106 may include non-organic dielectric materials such as silicon oxide, silicon nitride, silicon carbide, silicon oxynitride, or the like. It should be noted that the materials of the release layer 104, the carrier 102 and the dielectric layer 106 are merely for illustration, and the disclosure is not limited thereto. The dielectric layer 106 may be formed by a suitable fabrication technique such as coating, lamination, or deposition. The illustrated top surface of the dielectric layer 106, which is opposite to the illustrated bottom surface contacting the release layer 104, may be levelled and may have a high degree of planarity.

Figure 2:
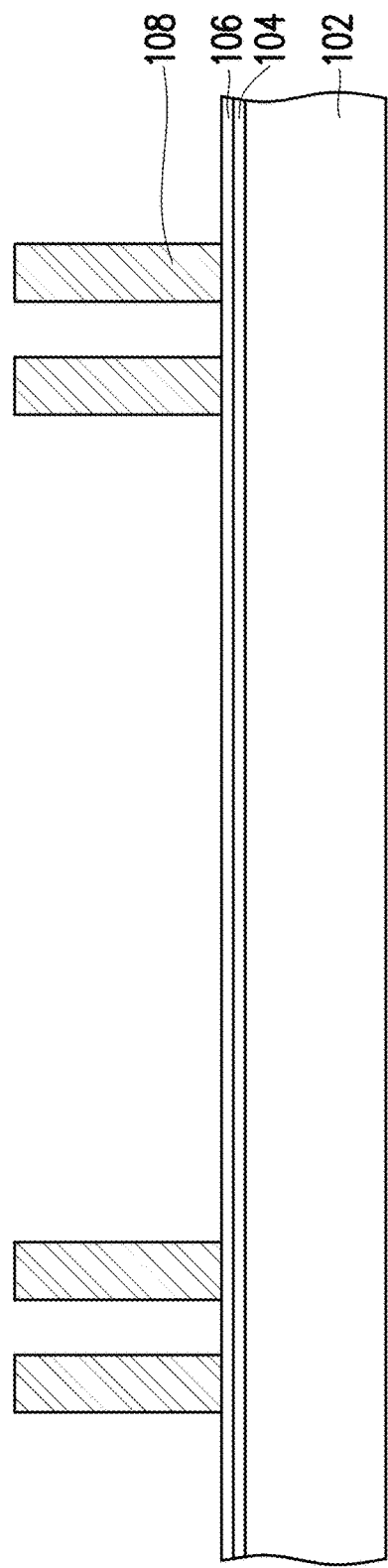

Referring to FIG. 2, after the carrier 102 having the release layer 104 and the dielectric layer 106 formed thereon is provided, conductive vias 108 are formed on the dielectric layer 106. In some embodiments, as shown in FIG. 2, the conductive vias 108 extend away from the dielectric layer 106 along a direction Z parallel to a normal direction of the carrier 102.

In some embodiments, the formation of the conductive vias 108 includes forming a mask pattern (not shown) with openings, then forming a metallic material (not shown) filling up the openings by electroplating or deposition, and removing the mask pattern to form the conductive vias 108 on the dielectric layer 106. In some embodiments, the material of the mask pattern includes a positive photo-resist or a negative photo-resist. In some embodiments, the material of the conductive vias 108 includes a metal material such as copper or copper alloys. The disclosure is not limited thereto.

In some alternative embodiments, the conductive vias 108 may be formed by forming a seed layer (not shown) on the dielectric layer 106; forming the mask pattern with openings exposing portions of the seed layer; forming the metallic material on the exposed portions of the seed layer to form the conductive vias 108 by plating; removing the mask pattern; and then removing portions of the seed layer exposed by the conductive vias 108. In some embodiments, the seed layer is a metal layer, which may be a single layer or a composite layer including a plurality of sub-layers formed of different materials. In a particular embodiment, the seed layer is a titanium layer and a copper layer over the titanium layer. Although four conductive vias 108 are presented in FIG. 2 for illustrative purposes, those skilled in the art can understand that the number of the conductive vias 108 may be more than or less than what is depicted in FIG. 2, and may be designated based on demand and/or design layout.

Figure 3:
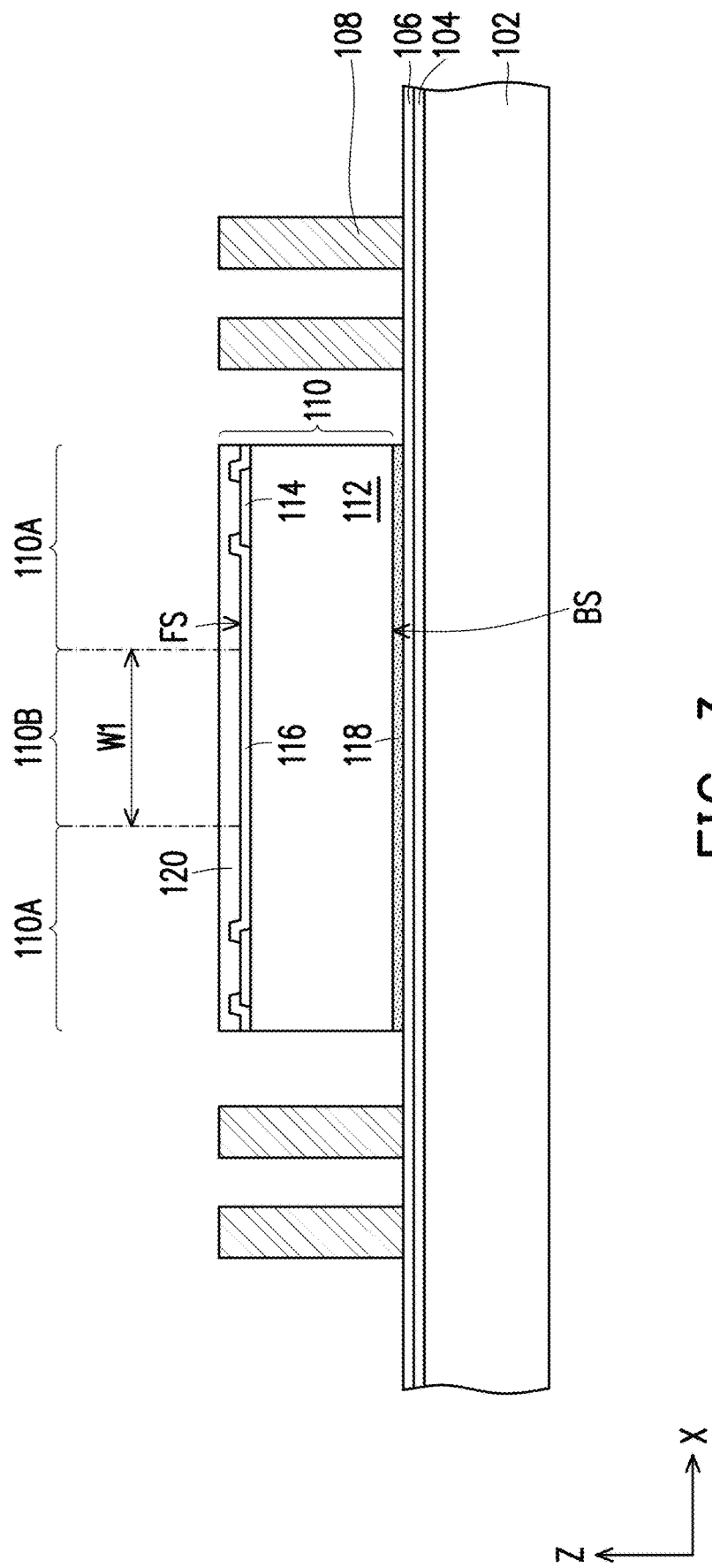

Referring to FIG. 3, an integrated circuit die 110 is attached (or adhered) to the dielectric layer 106 by an adhesive layer 118. In the exemplary embodiment, one integrated circuit die 110 is illustrated as being adhered in the illustrated package region. However, it should be noted that the number of the integrated circuit die 110 adhered in the illustrated package region is not limited thereto, and this can be adjusted based on design requirement. In some embodiments, as shown in FIG. 3, the integrated circuit die 110 is placed between conductive vias 108. For example, the conductive vias 108 are arranged to surround the integrated circuit die 110. In some embodiments, the integrated circuit die 110 is placed onto the dielectric layer 106 through a pick-and-place method. In the exemplary embodiment, the integrated circuit die 110 is picked and placed on the dielectric layer 106 after the formation of the conductive vias 108. However, the disclosure is not limited thereto. In some alternative embodiments, the integrated circuit die 110 may be picked and placed on the dielectric layer 106 before the formation of the conductive vias 108. The integrated circuit die 110 may be any type of die, such as a sensor die, logic die (e.g., central processing unit, microcontroller, etc.), memory die (e.g., dynamic random access memory (DRAM) die, static random access memory (SRAM) die, etc.), power management die (e.g., power management integrated circuit (PMIC) die), radio frequency (RF) die, micro-electro-mechanical-system (MEMS) die, signal processing die (e.g., digital signal processing (DSP) die), front-end die (e.g., analog front-end (AFE) die), the like, or a combination thereof.

Before being adhered to the dielectric layer 106, the integrated circuit die 110 may be processed according to applicable manufacturing processes to form integrated circuits in the integrated circuit die 110. In some embodiments, the integrated circuit die 110 includes a semiconductor substrate 112, such as doped or undoped silicon, or an active layer of a semiconductor-on-insulator (SOI) substrate. The semiconductor substrate 112 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered substrate or gradient substrate, may also be used. Devices, such as transistors, diodes, capacitors, resistors, etc., may be formed in and/or on the active surface of the semiconductor substrate 112 and may be interconnected by interconnect structures formed by, for example, metallization patterns in one or more dielectric layers on the semiconductor substrate 112 to form an integrated circuit.

The adhesive layer 118 is on the back surface BS of the integrated circuit die 110 (i.e., the illustrated bottom surface of the semiconductor substrate 112). In some embodiments, the adhesive layer 118 include a die attach film (DAF). However, the disclosure is not limited thereto. In some alternative embodiments, other materials may be adapted as the adhesive layer 118 as long as the said material is able to strengthen the adhesion between the dielectric layer 106 and the integrated circuit die 110. In some alternative embodiments, the adhesive layer 118 may be any materials used for fusion bonding of the dielectric layer 106 to the integrated circuit die 110. For example, the adhesive layer 118 is an oxide-based film (e.g., silicon oxide film) used for oxide-oxide fusion bonding.

In some embodiments, the integrated circuit die 110 further includes pads 114, such as aluminum pads, copper pads, or the like, to which external connections are made. The pads 114 are on the active surface of the semiconductor substrate 112. In the exemplary embodiment, two pads 114 are illustrated in FIG. 3. However, it should be noted that the number of the pads 114 of the integrated circuit die 110 is not limited thereto, and this can be adjusted based on design requirement. Further, in some embodiments, the integrated circuit die 110 includes a passivation film 116 on the semiconductor substrate 112 and the pads 114. In detail, as shown in FIG. 3, openings extend through the passivation film 116 to expose portions of the pads 114. The passivation film 116 may be a silicon oxide layer, a silicon nitride layer, a silicon oxy-nitride layer, or a dielectric layer formed by other suitable dielectric materials. In this stage, as shown in FIG. 3, the integrated circuit die 110 further includes a sacrificial film 120 on the passivation film 116 and the pads 114. From another point of view, the sacrificial film 120 is disposed on the front surface FS (i.e., the active surface) of the integrated circuit die 110 opposite to the back surface BS and facing away from the carrier 102. That is to say, the surfaces the passivation film 116 and the pads 114 collectively form the front surface FS of the integrated circuit die 110. The sacrificial film 120 is formed of a photo-sensitive polymer, such as PBO, polyimide, BCB, or the like.

In some embodiments, the integrated circuit die 110 is a sensor die. The sensor die may be an image sensor, an acoustic sensor, or the like. The sensor die may include one or more transducers and may also include one or more features that emit signals for measurement during operation. For example, the sensor die may be a fingerprint sensor that operates by emitting ultrasonic acoustic waves and measuring reflected waves. The integrated circuit die 110 has an I/O region 110A and a sensing region 110B at the active surface of the integrated circuit die 110. The I/O region 110A may (or may not) surround the sensing region 110B. In some embodiments, the pads 114 are located within a span of the I/O region 110A. In some embodiments, the width W1 of the sensing region 110B along a direction X perpendicular to the direction Z is in the range of from about 10000 μm to about 35000 μm. In some embodiments, the sensor die is packaged in an InFO package, and is packaged in a manner that allows the sensing region 110B to be exposed.

Figure 4:
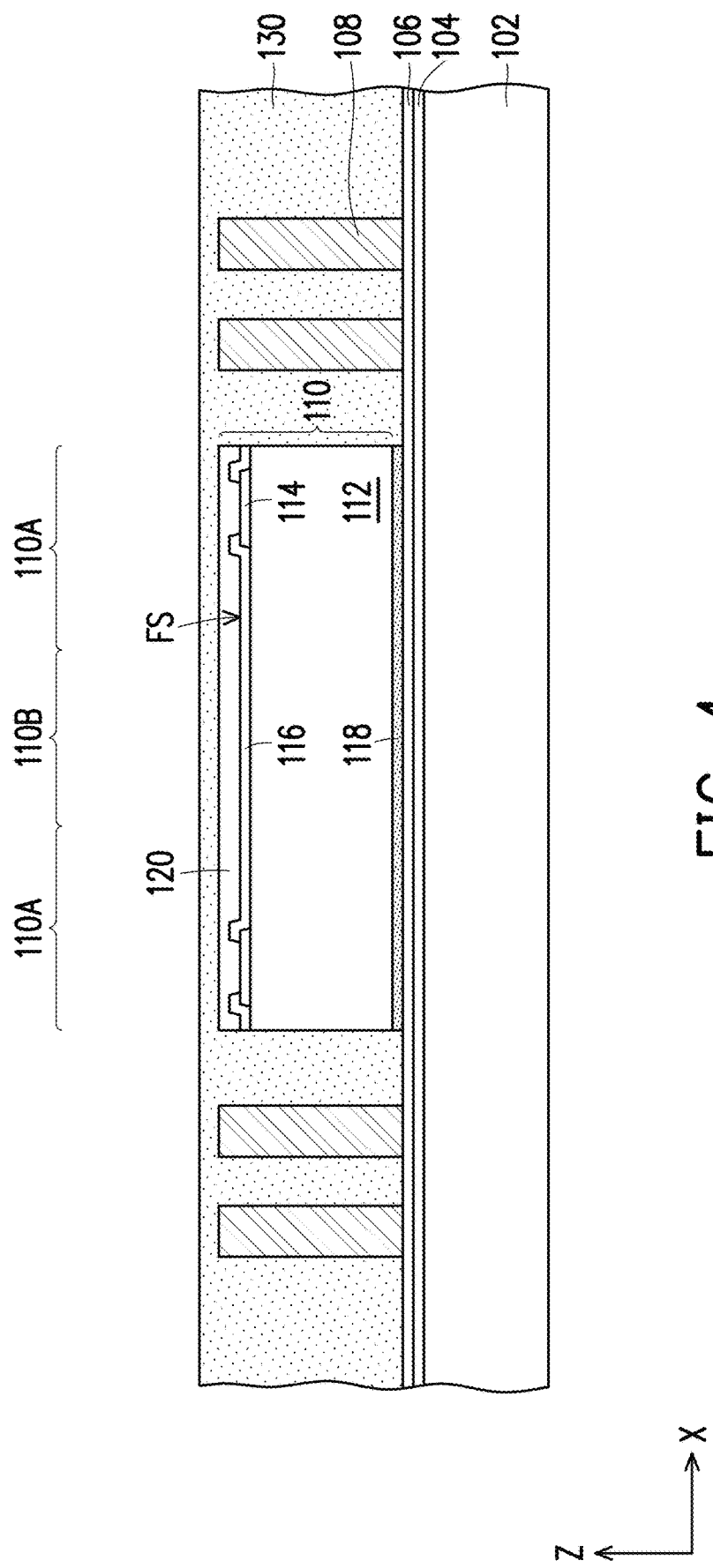

Referring to FIG. 4, an encapsulant 130 is formed on the dielectric layer 106 and over the integrated circuit die 110 and the conductive vias 108. As shown in FIG. 4, the encapsulant 130 is formed to fill the gaps between the integrated circuit die 110 and the conductive vias 108 to encapsulate the integrated circuit die 110. The encapsulant 130 also fills the gaps between adjacent conductive vias 108 to encapsulate the conductive vias 108. In some embodiments, the encapsulant 130 is referred to as "gap-fill material". Further, in this stage, as shown in FIG. 4, the integrated circuit die 110 and the conductive vias 108 are encapsulated by and well protected by the encapsulant 130. In some embodiments, the encapsulant 130 is formed through an over-molding process or a film deposition process. For example, the over-molding process is a compression molding process. In some embodiments, the film deposition process may include chemical vapor deposition (CVD), high density plasma chemical vapor deposition (HDPCVD), plasma enhanced chemical vapor deposition (PECVD), atomic layer deposition (ALD), or combinations thereof. In some embodiments, the encapsulant 130 includes a molding compound, a molding underfill, a resin (such as epoxy resin), or the like. In some alternative embodiments, the encapsulant 130 includes silicon oxide ($SiO_x$, where x>0), silicon oxynitride ($SiO_xN_y$, where x>0 and y>0), silicon nitride ($SiN_x$, where x>0), or other suitable dielectric material. In some embodiments, the encapsulant 130 includes a base material (e.g., a polymer, a resin or the like) and filler particles (e.g., silica, clay or the like) distributed in the base material.

Figure 5:
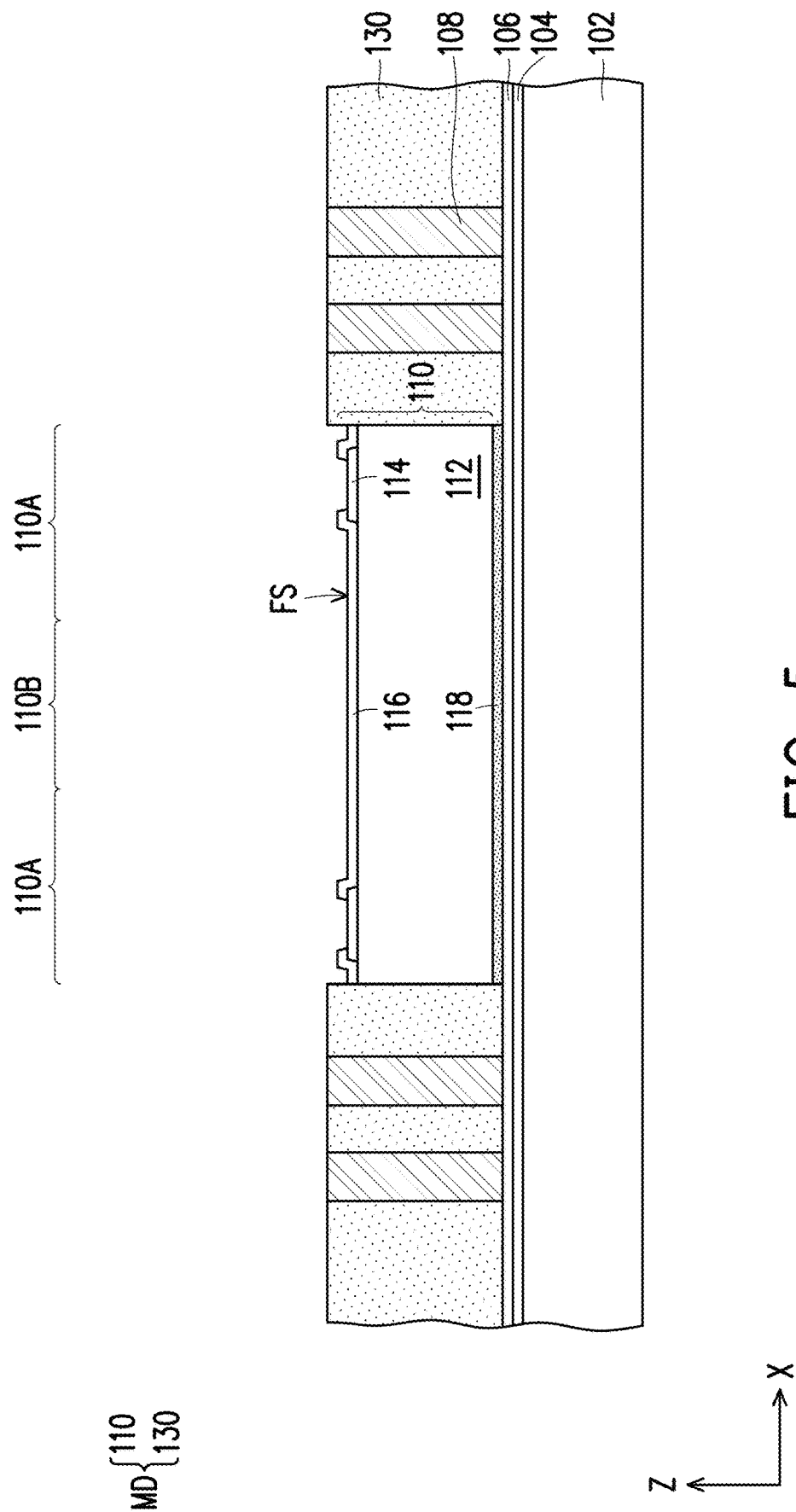

Referring to FIG. 5, a planarization process is performed on the encapsulant 130 to expose the conductive vias 108 and the sacrificial film 120. In some embodiments, during the planarization process, the conductive vias 108 and the sacrificial film 120 may also slightly ground, such that the illustrated top surfaces of the encapsulant 130, the conductive vias 108 and the sacrificial film 120 are substantially levelled with and coplanar to one another. As shown in FIG. 4 and FIG. 5, after performing the planarization process, the integrated circuit die 110 and the conductive vias 108 are laterally encapsulated by the encapsulant 130 having reduced thickness. In other words, the conductive vias 108 penetrate through the encapsulant 130 having reduced thickness. Since the conductive vias 108 penetrate through the encapsulant 130, in some embodiments, the conductive vias 108 may be referred to as through interlayer vias (TIVs) or through InFO vias. From another point of view, as shown in FIG. 5, after performing the planarization process, the illustrated top surfaces of the encapsulant 130 and the conductive vias 108 are above the illustrated top surface (i.e., the active surface) of the semiconductor substrate 112. In some embodiments, the planarization process is a chemical-mechanical polish (CMP) process, a mechanical grinding process, or the like. In some embodiments, after the planarization process, a cleaning step may be optionally performed. For example, the cleaning step is preformed to clean and remove the residue generated from the planarization process.

Then, the sacrificial film 120 is removed to expose the front surface FS of the integrated circuit die 110. As such, the sensing region 110B of the integrated circuit die 110 is exposed. As shown in FIG. 5, after the sacrificial film 120 is removed, the exposed front surface FS of the integrated circuit die 110 is below the illustrated top surface of the encapsulant 130. That is to say, a plane extending from the illustrated top surface of the encapsulant 130 is above the topmost surface (or point) of the passivation film 116, as shown in FIG. 5. When the sacrificial film 120 is a photo-sensitive polymer, the sacrificial film 120 may be removed by exposure and development. However, the disclosure is not limited thereto. In some alternative embodiments, the sacrificial film 120 may be removed by an etching process. From another point of view, after the sacrificial film 120 is removed, a molded semiconductor device MD including the integrated circuit die 110 and the encapsulant 130 is formed. In the molded semiconductor device MD, the integrated circuit die 110 is laterally encapsulated by the encapsulant 130. In this stage, the integrated circuit die 110 of the molded semiconductor device MD includes the semiconductor substrate 112, the pads 114 over the semiconductor substrate 112, and the passivation film 116 over the semiconductor substrate 112 and the pads 114. Further, the conductive vias 108 penetrate through the encapsulant 130 of the molded semiconductor device MD.

After the front surface FS of the integrated circuit die 110 is exposed, the redistribution structure 140 is subsequently formed on the molded semiconductor device MD and the conductive vias 108, which will be described in details in FIG. 6 to FIG. 8, FIG. 13 and FIG. 14. Noted that one example process to form the redistribution structure 140 is discussed herein and the redistribution structure 140 is shown as an example. More or fewer dielectric layers and conductive layers may be formed in the redistribution structure 140. If more dielectric layers and conductive layers are to be formed, steps and processes discussed below may be repeated. In some embodiments, the redistribution structure 140 is a front-side redistribution structure electrically connected with the integrated circuit die 110 and is electrically connected with the conductive vias 108.

Figure 6:
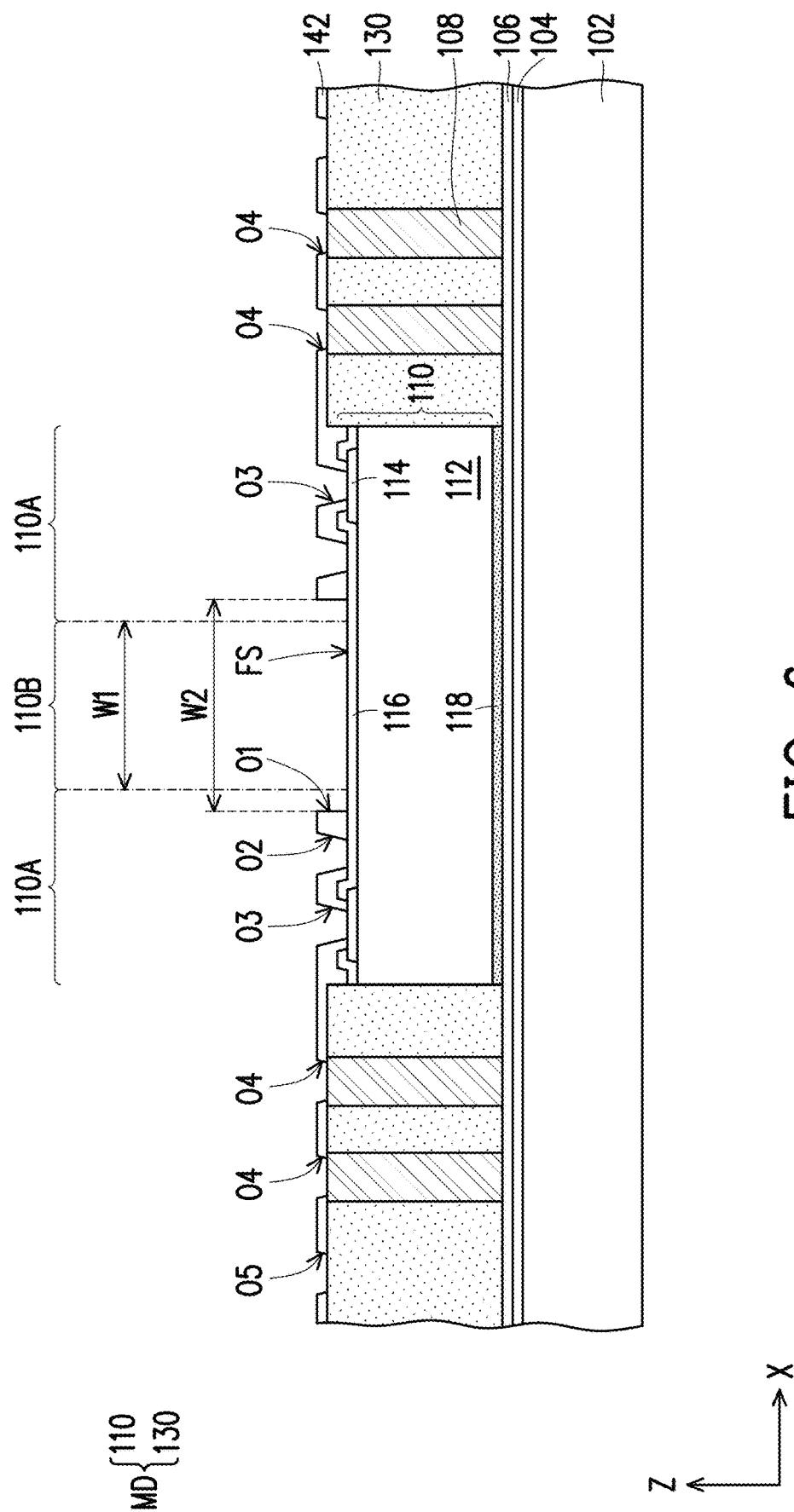

Referring to FIG. 6, a dielectric layer 142 is formed on the encapsulant 130, the conductive vias 108, the passivation film 116, and the pads 114. In detail, as shown in FIG. 6, the dielectric layer 142 has an opening O1 exposing the passivation film 116 at the sensing region 110B, an opening O2 exposing the passivation film 116 at the I/O region 110A, openings O3 exposing the pads 114, openings O4 exposing the conductive vias 108, and an opening O5 exposing the encapsulant 130. In some embodiments, the material of the dielectric layer 142 includes polyimide, epoxy resin, acrylic resin, phenol resin, BCB, PBO, or any other suitable polymer-based dielectric material. The dielectric layer 142 may be formed by suitable fabrication techniques such as spin-on coating, CVD, PECVD, or the like. In some embodiments, the opening O1, the opening O2, the openings O3, the openings O4 and the opening O5 may be formed by an acceptable process, such as by exposing the dielectric layer 142 to light when the dielectric layer 142 is a photo-sensitive material, or by a photolithography process and an etching process. If the dielectric layer 142 is a photo-sensitive material, the dielectric layer 142 can be developed after the exposure.

From the top view as shown in FIG. 13 and along the direction Z in FIG. 6, the vertical projection of the sensing region 110B falls within the span of the vertical projection of the opening O1. That is to say, the whole sensing region 110B is exposed by the opening O1. From another point of view, as show in FIG. 6, along the direction X, the opening O1 has a width W2, which is greater than the width W1 of the sensing region 110B. However, the disclosure is not limited thereto. In some alternative embodiments, the width W2 of the opening O1 may be equal to the width W1 of the sensing region 110B. In some embodiments, the width W2 of the opening O1 is in the range of from about 10050 μm to about 35200 μm. Since the dielectric layer 142 has the opening O1 exposing the whole sensing region 110B, the sensing region 110B of the integrated circuit die 110 is free from the material of the dielectric layer 142. That is to say, the dielectric layer 142 does not cover the sensing region 110B of the integrated circuit die 110.

In some embodiments, the width W2 of the opening O1 is greater than the widths of the opening O2, the opening O3, the opening O4 and the opening O5. Further, since the opening O2 expose the passivation film 116 at the I/O region 110A and the openings O3 expose the pads 114, portions of the front surface FS (i.e., the active surface) of the integrated circuit die 110 at the I/O region 110A are exposed by the dielectric layer 142. From another point of view, the dielectric layer 142 covers the I/O region 110A of the integrated circuit die 110, while does not cover the sensing region 110B of the integrated circuit die 110.

Figure 7:
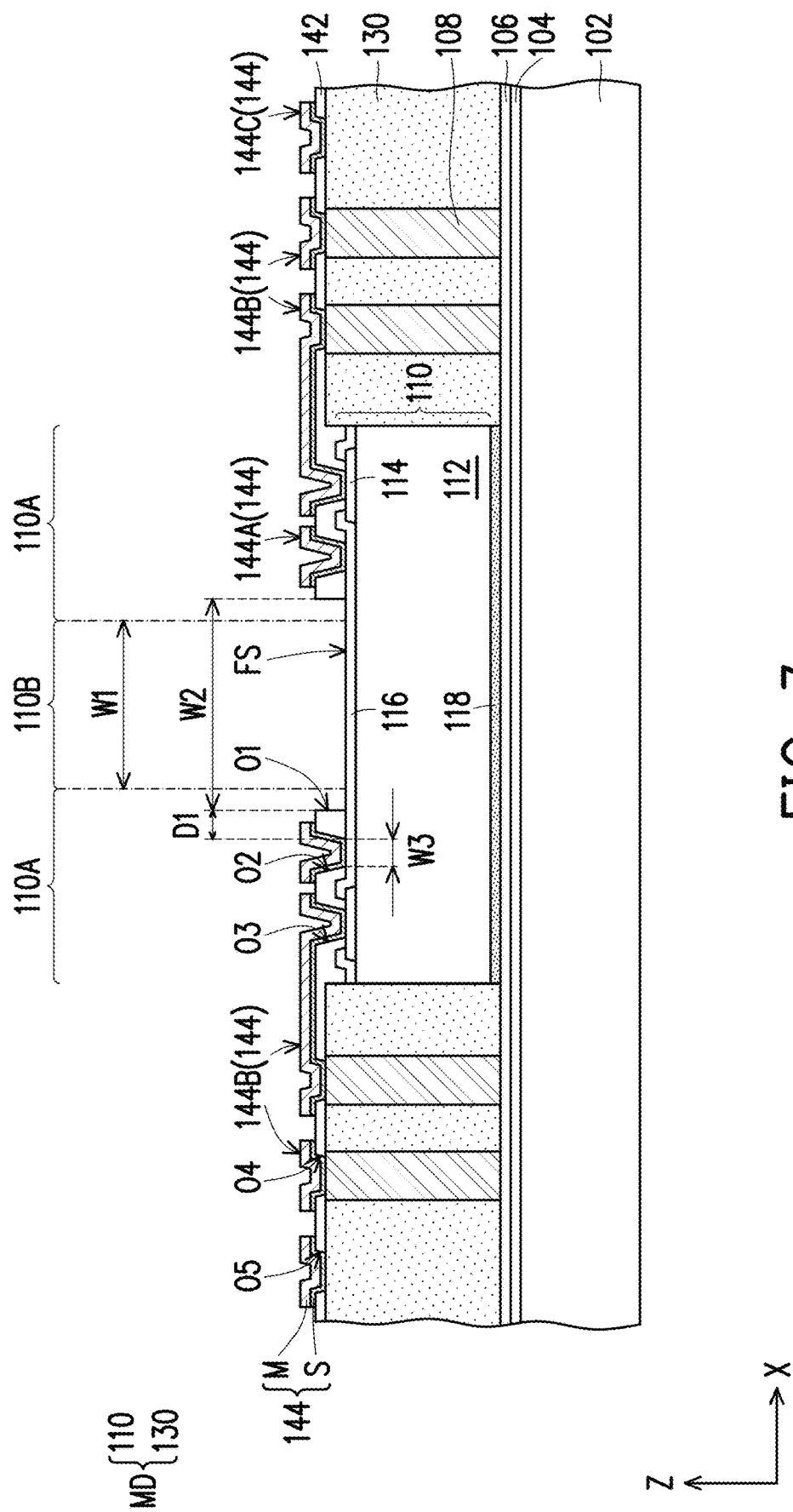

Referring to FIG. 7, a conductive layer 144 is formed on the dielectric layer 142. In some embodiments, as shown in FIG. 7, the conductive layer 144 includes a ring structure 144A, a redistribution pattern 144B and optionally a seal ring 144C. Since the ring structure 144A, the redistribution pattern 144B and the seal ring 144C are respectively a part of the conductive layer 144 and also are fabricated from the same conductive layer 144, the ring structure 144A, the redistribution pattern 144B and the seal ring 144C are located at substantially the same level with one another. Herein, when elements are described as "at substantially the same level", the elements are formed from the same layer. In some embodiments, the elements at substantially the same level are formed from the same material(s) with the same process step(s). In some embodiments, the topmost surfaces (or points) of the elements at substantially the same level are substantially coplanar. For example, in FIG. 7, the illustrated topmost surfaces of the ring structure 144A, the redistribution pattern 144B and the seal ring 144C at substantially the same level are substantially coplanar.

From another point of view, as shown in FIG. 7, the conductive layer 144 includes a seed layer S and a metal layer M disposed on the seed layer S. That is to say, each of the ring structure 144A, the redistribution pattern 144B and the seal ring 144C includes the seed layer S and the metal layer M. In some embodiments, to form the conductive layer 144, a seed material layer (not shown) is formed over the dielectric layer 142 and in the opening O1, the opening O2, the openings O3, the openings O4 and the opening O5 extending through the dielectric layer 142. In some embodiments, the seed material layer is formed in a conformal manner covering the profile of each of the opening O1, the opening O2, the openings O3, the openings O4 and the opening O5 in the dielectric layer 142. That is, the seed material layer extends into each of the opening O1, the opening O2, the openings O3, the openings O4 and the opening O5 to cover a bottom surface and sidewalls thereof, thereby to be in contact with the underlying passivation film 116, the underlying pads 114, the underlying conductive vias 108, and the underlying encapsulant 130. In some embodiments, the seed material layer is a metal layer, which may be a single layer or a composite layer including a plurality of sub-layers formed of different materials. In some embodiments, the seed material layer includes a titanium layer and a copper layer over the titanium layer. The seed material layer may be formed using, for example, PVD or the like.

Then, a photoresist is formed and patterned on the seed material layer. The photoresist may be formed by spin coating or the like and may be exposed to light for patterning. The pattern of the photoresist corresponds to the conductive layer 144. The patterning forms openings through the photoresist to expose the underlying seed material layer. Then, the metal layer M is formed in the openings of the photoresist and on the exposed portions of the underlying seed material layer. The metal layer M may be formed by plating, such as electroplating or electroless plating, or the like. The material of the metal layer M may include copper, titanium, tungsten, aluminum, the like, or combinations thereof. Next, the photoresist is removed by, for example, etching, ashing, or other suitable processes. The portions of the seed material layer exposed by the metal layer M upon removal of the photoresist are then removed to render the seed layer S covered by (underneath) the metal layer M. The exposed portions of the seed material layer may be removed through an etching process. In some embodiments, the material of the metal layer M may be different from the material of the seed material layer, so that the exposed portion of the seed material layer may be removed through selective etching.

As shown in FIG. 7, the metal layer M is not in contact with the dielectric layer 142 directly. In other words, the metal layer M and the dielectric layer 142 are spaced by the seed layer S. Accordingly, the seed layer S is capable of blocking the material of the metal layer M from diffusing onto the surface of the dielectric layer 142, and thus the adhesion between the dielectric layer 142 and the dielectric layer 142 is not deteriorated. In such case, the seed layer S is referred to as a barrier layer.

As shown in FIG. 7, the conductive layer 144 is not formed in the opening O1, such that the opening O1 is free from the material of the conductive layer 144. As mentioned above, since the opening O1 exposes the whole sensing region 110B, the conductive layer 144 does not cover the sensing region 110B of the integrated circuit die 110. As shown in FIG. 7, the ring structure 144A extends through the opening O2 to be physically connected with the portion of the passivation film 116 exposed by the opening O2. That is to say, the ring structure 144A is physically connected with the front surface FS (i.e., the active surface) of the integrated circuit die 110. In other words, the seed layer S of the ring structure 144A is directly in contact with the passivation film 116 at the front surface FS. As such, the adhesion of the ring structure 144A to the passivation film 116 is greater than the adhesion of the dielectric layer 142 to the passivation film 116. From another point of view, the ring structure 144A is electrically insulated from the integrated circuit die 110. Since the opening O2 is located at the I/O region 110A, the ring structure 144A extending through the opening O2 is located at the I/O region 110A. In other words, the conductive layer 144 covers the I/O region 110A of the integrated circuit die 110 without covering the sensing region 110B of the integrated circuit die 110.

As shown in the top view of FIG. 13, the ring structure 144A surrounds the opening O2 and the sensing region 110B. As shown in FIG. 13, from the top view, the shape of the ring structure 144A is a quadrilateral ring shape. However, the disclosure is not limited thereto. In some alternative embodiments, the shape of the ring structure 144A may be a circle, any other suitable polygon, or any other suitable shape from a top plan view. As shown in FIG. 7 and FIG. 13, the ring structure 144A is located between the opening O1 and each of the pads 114. That is to say, the ring structure 144A is closer to the sensing region 110B than the pads 114. From another point of view, as shown in the top view of FIG. 13, along the direction Z, the vertical projection of the ring structure 144A falls within the span of the vertical projection of the integrated circuit die 110. Although thirty pads 114 are presented in the illustrated package region of FIG. 13 for illustrative purposes, those skilled in the art can understand that the number of the pads 114 may be more than or less than what are depicted in FIG. 13, and may be designated based on demand and/or design layout.

In some embodiments, the bottom surface of the ring structure 144A contacting with the passivation film 116 is spaced apart from the sidewall of the opening O1 defined by the dielectric layer 142 with a minimum distance D1, as shown in FIG. 7, FIG. 13 and FIG. 14. Herein, the bottom surface of the ring structure 144A contacting with the passivation film 116 is referred to as a contacting surface of the ring structure 144A throughout the description. In certain embodiments, the minimum distance D1 between the contacting surface of the ring structure 144A and the sidewall of the opening O1 ranges from about 5 μm to about 100 μm. As such, more flexibility is provided for the design of the layout of the conductive layer 144, while the protection from the delamination propagation is provided to ensure the reliability of the resulting semiconductor package 100. Further, in some embodiments, the contacting surface of the ring structure 144A has a width W3 in the range of from about 5 μm to about 50 μm along the direction X, as shown in FIG. 7, FIG. 13 and FIG. 14. As such, more flexibility is provided for the design of the layout of the conductive layer 144, while the protection from the delamination propagation is provided to ensure the reliability of the resulting semiconductor package 100.

As shown in FIG. 7, the redistribution pattern 144B extends through the openings O3 and the openings O4 to be physically connected with the portions of the pads 114 exposed by the openings O3 and the portions of the conductive vias 108 exposed by the openings O4. As such, the seed layer S of the redistribution pattern 144B is directly in contact with the conductive vias 108 and the front surface FS of the integrated circuit die 110. From another point of view, the redistribution pattern 144B is electrically connected with the integrated circuit die 110 and the conductive vias 108, while is electrically insulated from the ring structure 144A. Since the openings O3 are located at the I/O region 110A and the openings O4 are located above the conductive vias 108, the redistribution pattern 144B extending through the openings O3 and the openings O4 may extend from within the span of the integrated circuit die 110 to outside the span of the integrated circuit die 110. In some embodiments, the redistribution pattern 144B includes contact pads and trace lines (such as routing traces or fan-out traces). Although forty conductive vias 108 are presented in the illustrated package region of FIG. 13 for illustrative purposes, those skilled in the art can understand that the number of the conductive vias 108 may be more than or less than what are depicted in FIG. 13, and may be designated based on demand and/or design layout.

As shown in FIG. 7, the seal ring 144C extends through the opening O5 to be physically connected with the portion of the encapsulant 130 exposed by the opening O5. As such, the seed layer S of the seal ring 144C is directly in contact with the encapsulant 130. As shown in the top view of FIG. 13, along the direction Z, the vertical projection of the seal ring 144C falls within the span of the vertical projection of the encapsulant 130. From another point of view, as shown in FIG. 7 and FIG. 13, the seal ring 144C that is optionally formed on the encapsulant 130 of the molded semiconductor device MD surrounds the ring structure 144A and the redistribution pattern 144B. As such, the seal ring 144C is configured to stop undesirable moisture and mobile ionic contaminants from penetrating through the redistribution structure 140 and through the side surfaces of the resulting semiconductor package 100 into a functional circuit area of the integrated circuit die 110. Moreover, the seal ring 144C can enable structural reinforcement of the resulting semiconductor package 100, thereby preventing operational reliability of the integrated circuit die 110 from being degraded. Although as shown in the top view of FIG. 13, the shape of the seal ring 144C is a quadrilateral ring shape. However, the disclosure is not limited thereto. In some alternative embodiments, the shape of the seal ring 144C may be a circle, any other suitable polygon, or any other suitable shape from a top plan view. Further, the seal ring 144C is electrically insulated from the ring structure 144A and the redistribution pattern 144B.

Figure 8:
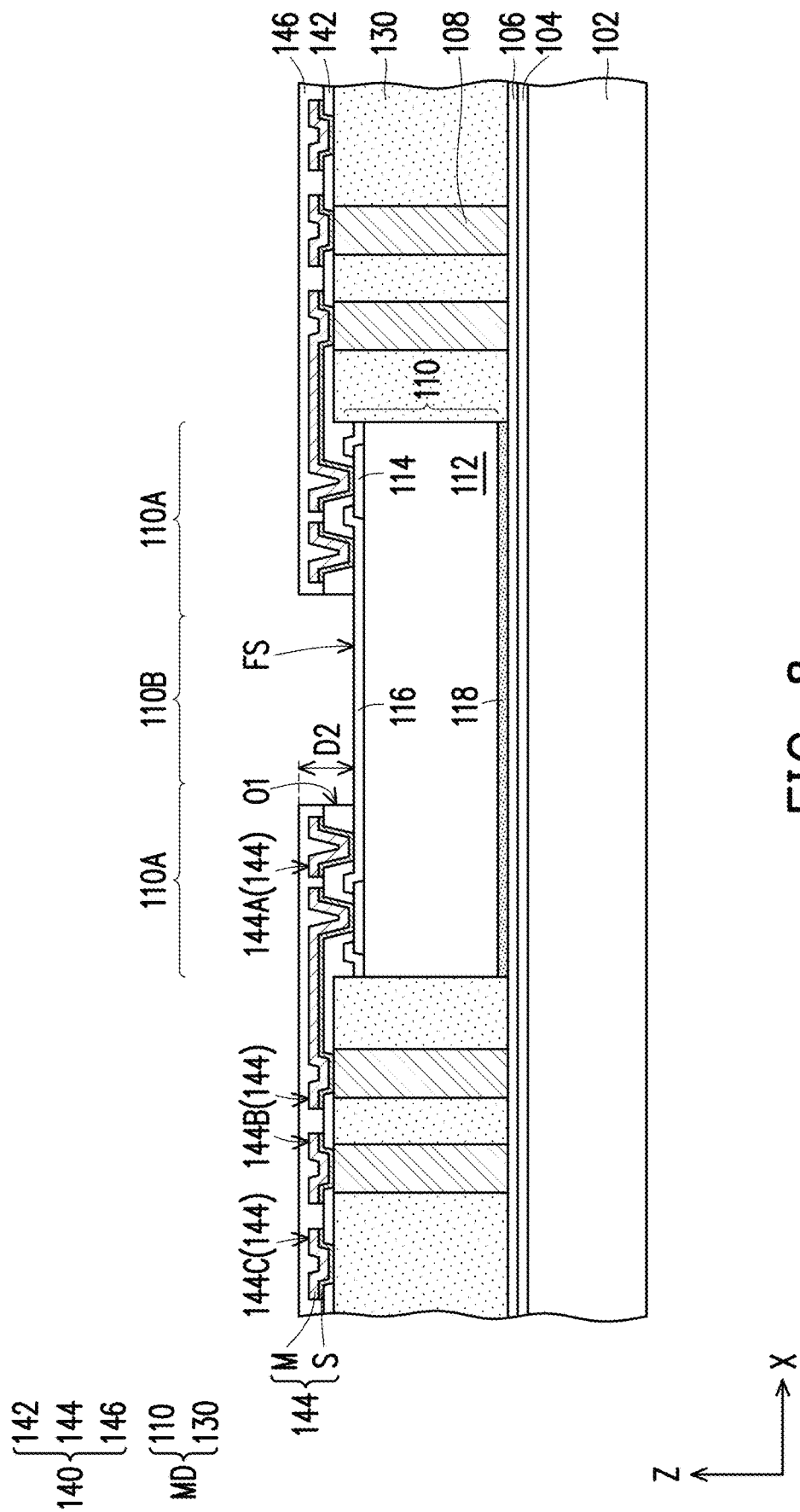

Referring to FIG. 8, a dielectric layer 146 is formed on the conductive layer 144 and the dielectric layer 142. The dielectric layer 146 may be formed in a manner similar to the dielectric layer 142, and may be formed of the same material as the dielectric layer 142. The opening O1 is then extended through the dielectric layer 146 by patterning the dielectric layer 146 in a similar manner as the patterning of the dielectric layer 142. That is to say, at this stage, the opening O1 is defined by the dielectric layer 146 and the dielectric layer 142. After the opening O1 is formed to extend through the dielectric layer 146 and the dielectric layer 142, the opening O1 has a depth D2 extending from a major surface of the passivation film 116 to a topmost surface of the dielectric layer 146. In some embodiments, the depth D2 is in the range of from about 17 μm to about 25 μm (such as less than about 25 μm). Moreover, as shown in FIG. 8, the ring structure 144A is spaced apart or separated from the redistribution pattern 144B by the dielectric layer 142 and the dielectric layer 146. Similarly, the seal ring 144C is spaced apart from the redistribution pattern 144B by the dielectric layer 142 and the dielectric layer 146.

Up to here, the redistribution structure 140 according to some embodiments of the present disclosure has been formed. Referring to FIG. 8, the redistribution structure 140 includes the dielectric layer 142, the conductive layer 144, and the dielectric layer 146. In detail, as shown in FIG. 8, the conductive layer 144 is sandwiched between the dielectric layer 142 and the dielectric layer 146, but the bottom surface of the conductive layer 144 is exposed by the dielectric layer 142 to connect the underlying passivation film 116, the underlying pads 114, the underlying conductive vias 108, and the underlying encapsulant 130. Moreover, as shown in FIG. 8, the redistribution structure 140 includes the opening O1 extending through the dielectric layers 142 and 146, and exposing the sensing region 110B of the integrated circuit die 110. Further, the conductive layer 144 is not formed in the opening O1, such that an air gap being free from liquid and solid materials is over the sensing region 110B. The opening O1 exposes the sensing region 110B of the integrated circuit die 110, allowing the sensing region 110B to be used even when the integrated circuit die 110 is packaged and encapsulated. After forming the opening O1, the I/O region 110A of the integrated circuit die 110 remains covered by the redistribution structure 140.

As shown in FIG. 8 and FIG. 13, the ring structure 144A surrounding the opening O1 is in contact with the front surface FS of the integrated circuit die 110 and is disposed between the opening O1 and each of the pads 114. As such, even the opening O1 induces the potential moisture attack concern, by arranging the ring structure 144A in the redistribution structure 140, the protection from the delamination propagation resulted by the moisture is provided to ensure the reliability of the resulting semiconductor package 100.

In the embodiment shown above, the opening O1 is formed during formation of the redistribution structure 140. However, the disclosure is not limited thereto. In some alternative embodiments, the opening O1 may also be formed after formation of the redistribution structure 140. For example, the opening O1 may be formed through the dielectric layers 142 and 146 by an anisotropic etching process after the dielectric layers 142 and 146 are both formed.

Figure 9:
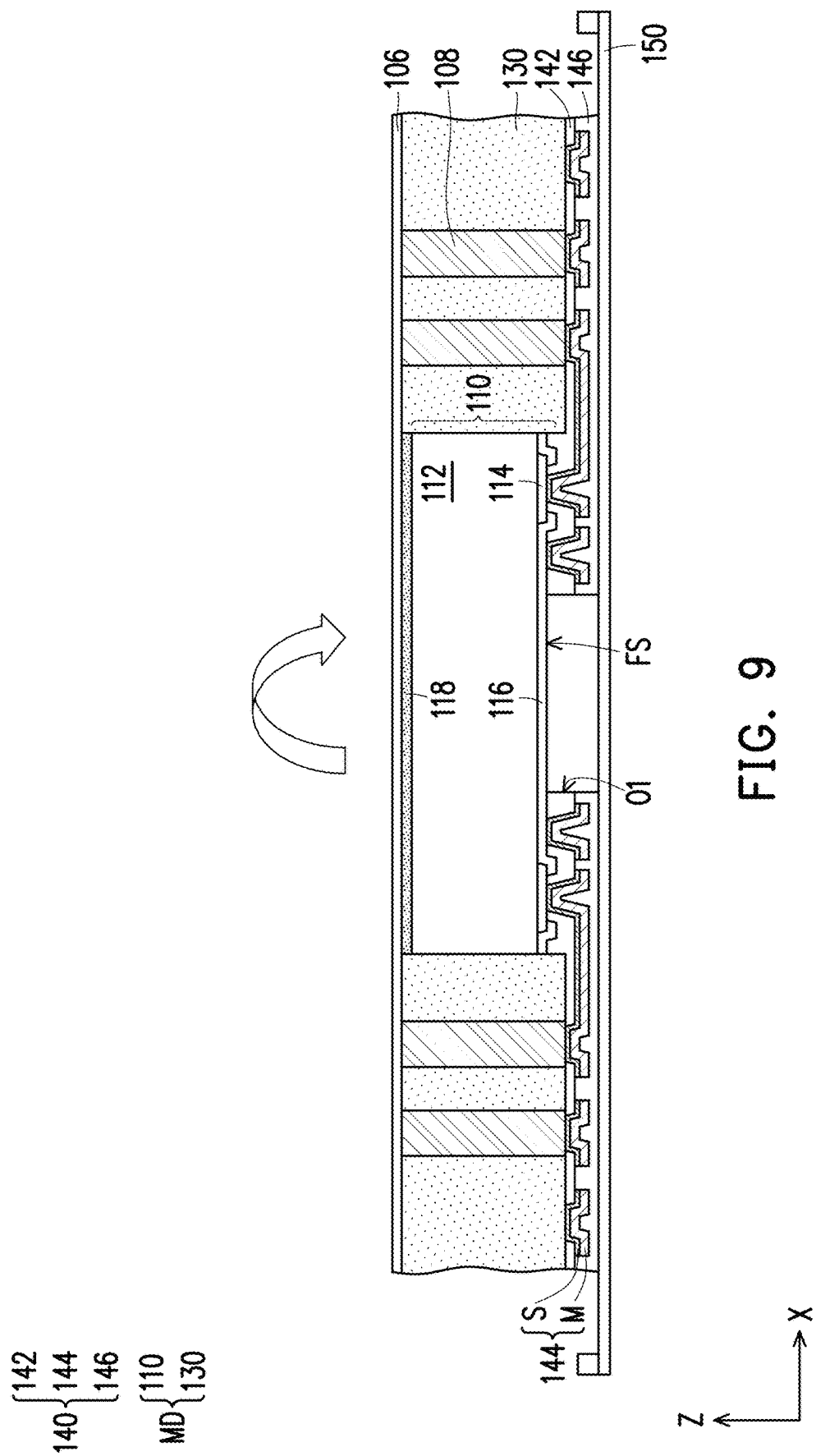

Referring to FIG. 9, a de-bonding process is performed to detach (or "de-bond") the carrier 102 from the release layer 104. In some embodiments, the de-bonding process includes projecting a light such as a laser light or an UV light on the release layer 104 so that the release layer 104 decomposes under the heat of the light and the carrier 102 can be removed. After the carrier 102 is de-bonded, the structure is then flipped (turned upside down) and placed on a fixture 150. In detail, as shown in FIG. 9, the redistribution structure 140 is in contact with the fixture 150. In some embodiments, the fixture 150 is a carrier tape. However, the disclosure is not limited thereto. In some alternative embodiments, the fixture 150 may be another suitable type of carrier for carrying the structure de-bonded from the carrier 102. As shown in FIG. 9, the remaining structure de-bonded from the carrier 102 is flipped, so that the exposed surface of the dielectric layer 106 faces upwards becomes the top surface.

Figure 10:
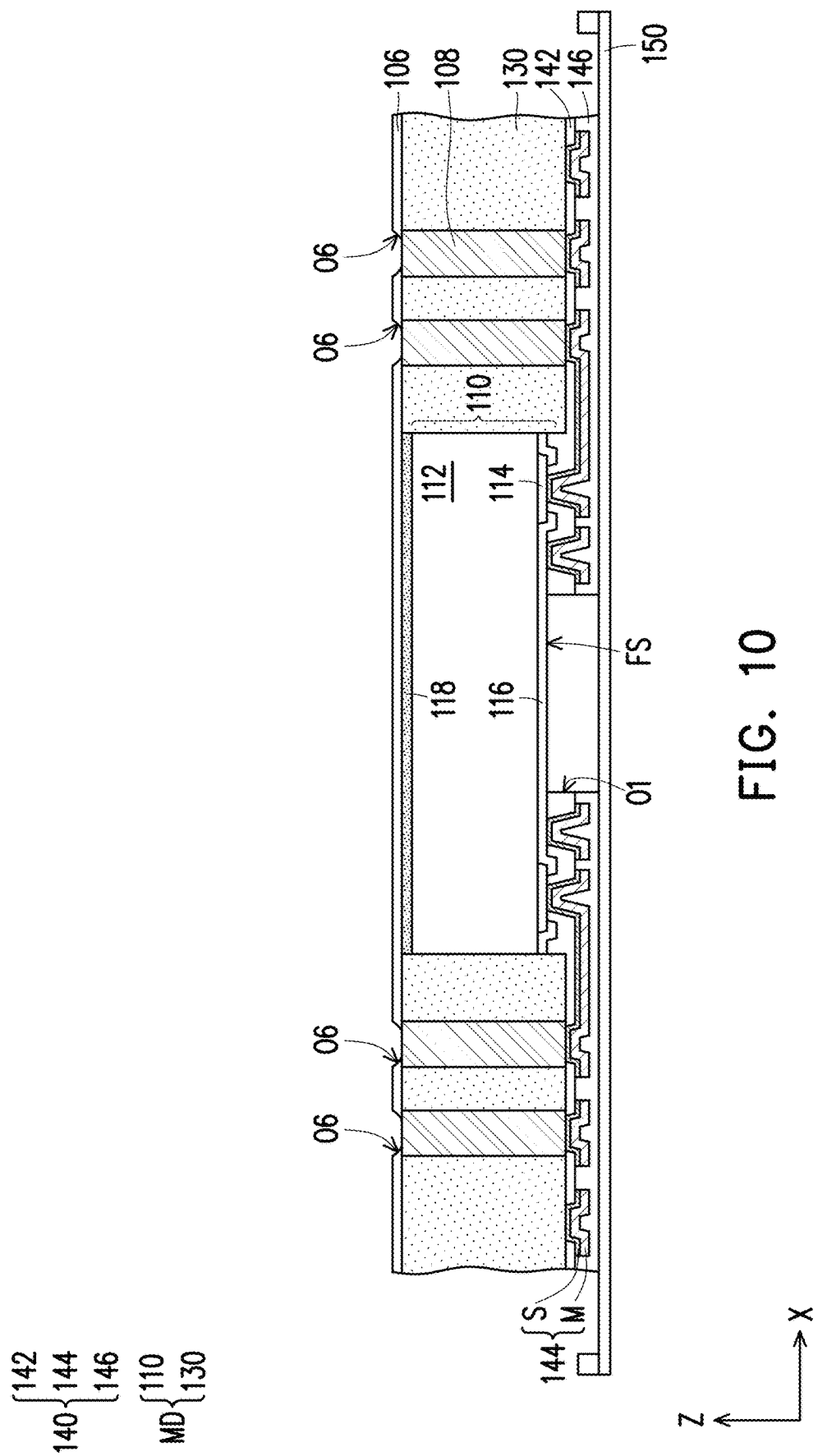

Referring to FIG. 10, contact openings O6 are formed through the dielectric layer 106 to expose portions of the conductive vias 108. The contact openings O6 may be formed, for example, using a laser drilling process, a mechanical drilling process, a photolithography process, or other suitable processes. A cleaning process may be performed after the laser drilling process, to remove remaining residue of the dielectric layer 106.

Figure 11:
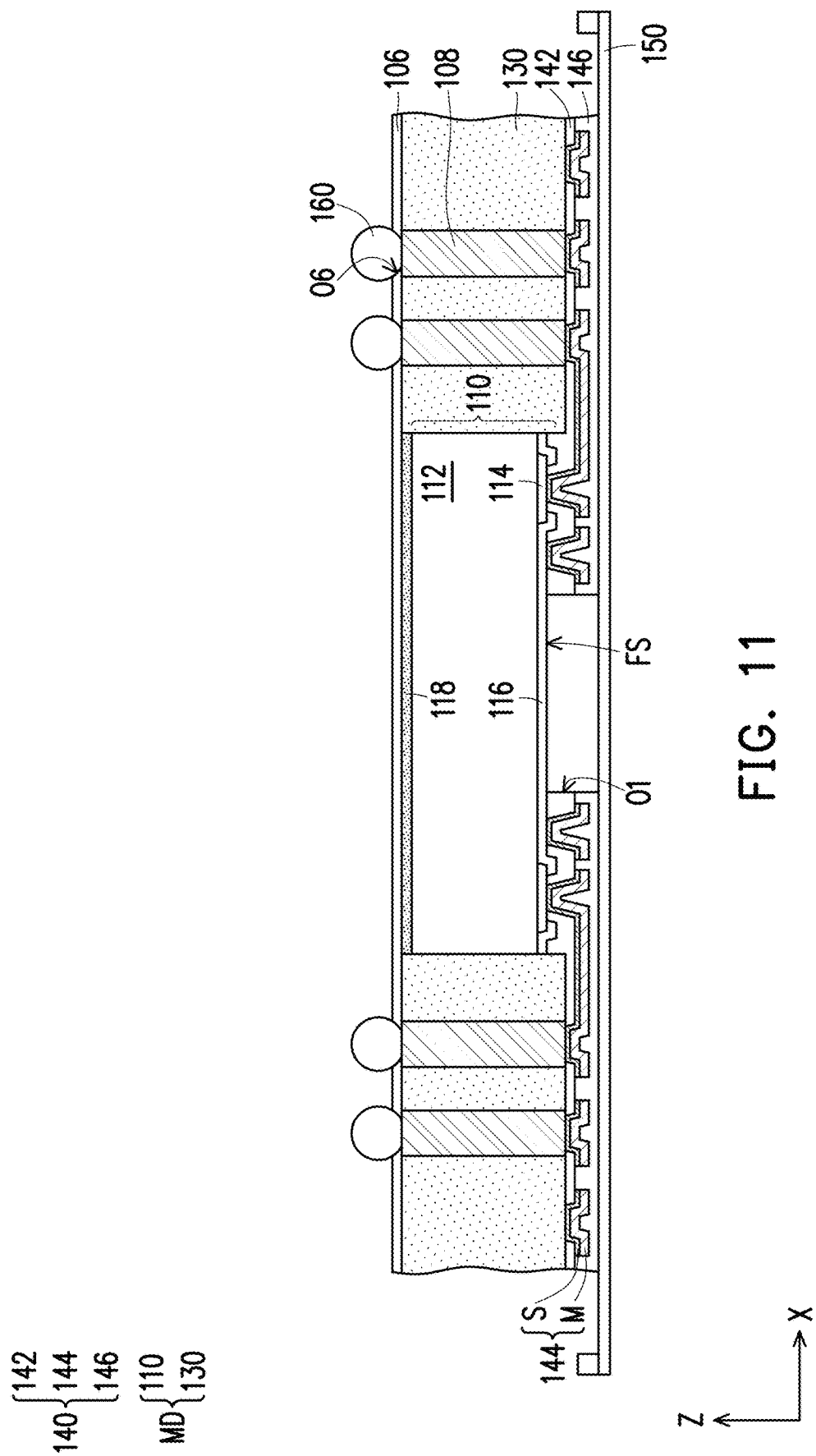

Referring to FIG. 11, conductive connectors 160 are formed in the contact openings O6, physically and electrically connected with the portions of the conductive vias 108 exposed by the contact openings O6. In some embodiments, as shown in FIG. 11, both ends of the conductive vias 108 exposed from the encapsulant 130 of the molded semiconductor device MD are electrically connected with the redistribution structure 140 and the conductive connectors 160. The conductive connectors 160 may include a conductive material such as solder, copper, aluminum, gold, nickel, silver, palladium, tin, the like, or a combination thereof. In some embodiments, the conductive connectors 160 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In some embodiments, the conductive connectors 160 include flux and are formed in a flux dipping process. In some embodiments, the conductive connectors 160 include a conductive paste such as solder paste, silver paste, or the like, and are dispensed in a printing process.

Figure 12:
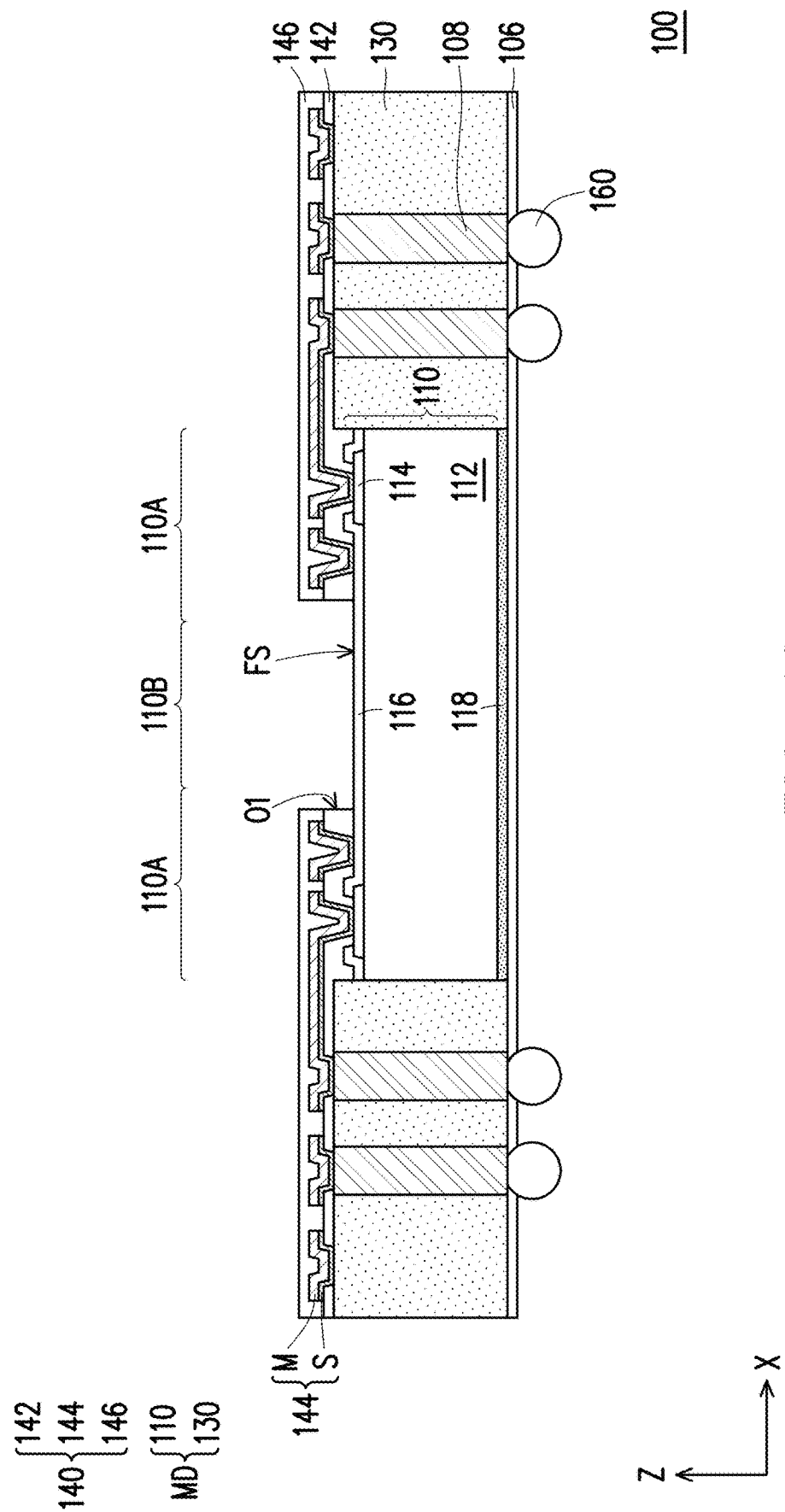

Referring to FIG. 11 and FIG. 12, after the formation of the conductive connectors 160, a singulation process is performed along scribe line regions between the adjacent package regions to cut the whole structure shown in FIG. 11 into a plurality of package structures 100. As mentioned, the manufacturing process described above is part of a wafer level packaging process, although one singulated semiconductor package 100 is shown in FIG. 12, those skilled in the art should understand that plural semiconductor packages 100 are obtained after the singulation process. In some embodiments, the singulation process is performed to cut through the dielectric layer 106, the encapsulant 130 of the molded semiconductor device MD and the redistribution structure 140, as shown in FIG. 11 and FIG. 12. The singulation process may be a blade saw process or a laser cutting process. In some embodiments, the fixture 150 is separated from the redistribution structure 140 after the singulation process. However, the disclosure is not limited thereto. In some alternative embodiments, the fixture 150 is separated from the redistribution structure 140 prior to the singulation process. In a subsequent process, the singulated semiconductor package 100 may, for example, be disposed onto a circuit substrate or onto other components based on requirements.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

Figure 15:
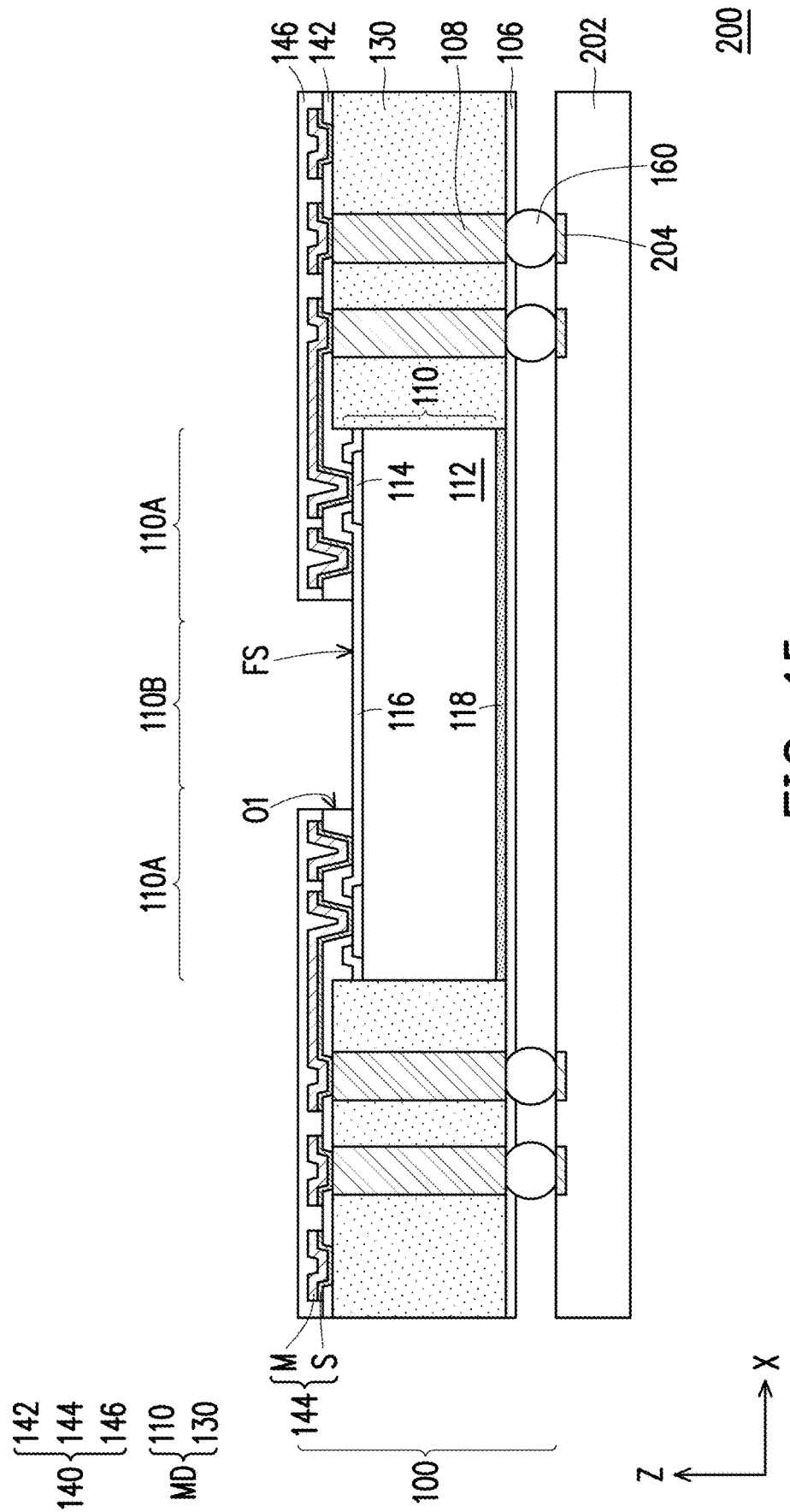
FIG. 15 is a schematic cross sectional view illustrating a sensing device in accordance with some embodiments of the disclosure.

FIG. 15 is a schematic cross sectional view illustrating a sensing device 200 in accordance with some embodiments of the disclosure. Referring to FIG. 15, the semiconductor package 100 is mounted to a package substrate 202 using the conductive connectors 160. The package substrate 202 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 202 may be a SOI substrate. The package substrate 202 is, in one alternative embodiment, based on an insulating core such as a fiberglass reinforced resin core. One example of the core material is fiberglass resin such as FR4. Alternatives for the core material include bismaleimide-triazine BT resin, or alternatively, other PCB materials or films. Build up films such as ABF or other laminates may be used for package substrate 202.

The package substrate 202 may include active devices (not shown) and/or passive devices (not shown). As those skilled in the art will recognize, a wide variety of devices such as transistors, capacitors, resistors, combinations of these, and the like may be used to generate the structural and functional requirements of the design for the sensing device 200.

The package substrate 202 may also include metallization layers and vias (not shown) and bond pads 204 over the metallization layers and vias. The metallization layers may be formed over the active devices and/or passive devices, and be designed to connect the various devices to form functional circuitry. The metallization layers may be formed of alternating layers of dielectric (e.g., low-k dielectric material) and conductive material (e.g., copper) with vias interconnecting the layers of conductive material, and may be formed through any suitable process (such as deposition, damascene, dual damascene, or the like). In some embodiments, the package substrate 202 is substantially free of active and passive devices.

In some embodiments, the conductive connectors 160 are reflowed to attach the semiconductor package 100 to the bond pads 204. In detail, the conductive connectors 160 are electrically and physically connected with the package substrate 202 through the bond pads 204. In some embodiments, passive devices (e.g., surface mount devices (SMDs), not illustrated) may be attached to the semiconductor package 100 before the semiconductor package 100 is mounted on the package substrate 202. In such embodiments, the passive devices may be bonded to the same surface of the semiconductor package 100 as the conductive connectors 160.

The conductive connectors 160 may have an epoxy flux (not shown) formed thereon before they are reflowed, with at least some of the epoxy portion of the epoxy flux remaining after the semiconductor package 100 is attached to the package substrate 202. This remaining epoxy portion may act as an underfill to reduce stress and protect the joints resulting from the reflowing the conductive connectors 160. In some embodiments, an underfill (not shown) may be formed between the semiconductor package 100 and the package substrate 202, and surrounding the conductive connectors 160. The underfill may be formed by a capillary flow process after the semiconductor package 100 is attached, or may be formed by a suitable deposition method before the semiconductor package 100 is attached.

In the semiconductor package 100 illustrated in FIG. 12, the illustrated top surface of the encapsulant 130 is above the topmost surface (or point) of the passivation film 116. However, the disclosure is not limited thereto. In some alternative embodiments, the illustrated top surface of the encapsulant 130 is below the topmost surface (or point) of the passivation film 116. Hereinafter, other embodiments will be described with reference to FIG. 16.

Figure 16:
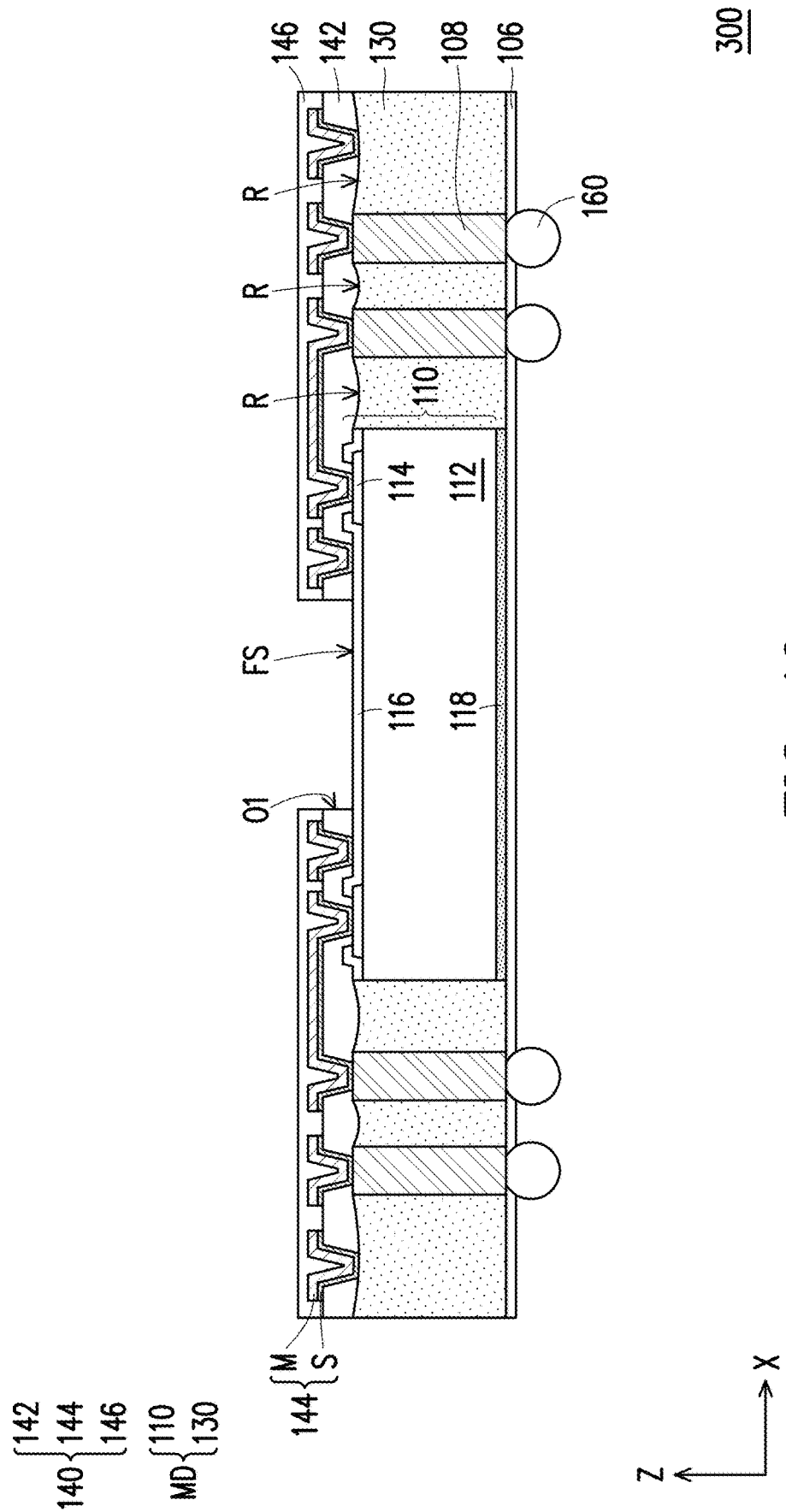
FIG. 16 is a schematic cross sectional view illustrating a semiconductor package in accordance with some alternative embodiments of the disclosure.

FIG. 16 is a schematic cross sectional view illustrating a semiconductor package 300 in accordance with some alternative embodiments of the disclosure. The semiconductor package 300 illustrated in FIG. 16 is similar to the semiconductor package 100 illustrated in FIG. 12, hence the same reference numerals are used to refer to the same or liked parts, and its detailed description will be omitted herein. The differences between the semiconductor package 300 and the semiconductor package 100 will be described below.

Referring to FIG. 16, the encapsulant 130 at least laterally encapsulating the conductive vias 108 and the integrated circuit die 110 has recesses R. In detail, as shown in FIG. 16, the recesses R are formed between respective ones of the conductive vias 108 and the integrated circuit die 110, and between adjacent conductive vias 108. In the embodiment shown, the encapsulant 130 is formed by a transfer molding process, such that the conductive vias 108 and integrated circuit die 110 are exposed after molding, and planarization step(s) (e.g., a CMP process) may be omitted. As shown in FIG. 16, the illustrated topmost surface (or point) of the passivation film 116 is above the illustrated topmost surface (or point) of the encapsulant 130. That is to say, a plane extending from the illustrated topmost surface of the passivation film 116 is above the illustrated topmost surface of the encapsulant 130. In other words, a portion of the integrated circuit die 110 protrudes from the encapsulant 130 along the direction Z. From another point of view, the illustrated top surfaces of the encapsulant 130 and the conductive vias 108 may not be level, because when the encapsulant 130 is formed by a transfer molding process, a planarization step may be omitted. Moreover, as shown in FIG. 16, portions of the dielectric layer 142 fill the recesses R. Further, although not shown, the semiconductor package 300 may further be mounted onto a package substrate using the conductive connectors 160 as described with reference to FIG. 15.

In the semiconductor package 100 illustrated in FIG. 12, only one redistribution structure 140 (i.e., the front-side redistribution structure) is disposed on the molded semiconductor device MD. However, the disclosure is not limited thereto. In some alternative embodiments, plural redistribution structures may be disposed on the molded semiconductor device MD. Hereinafter, other embodiments will be described with reference to FIG. 17.

Figure 17:
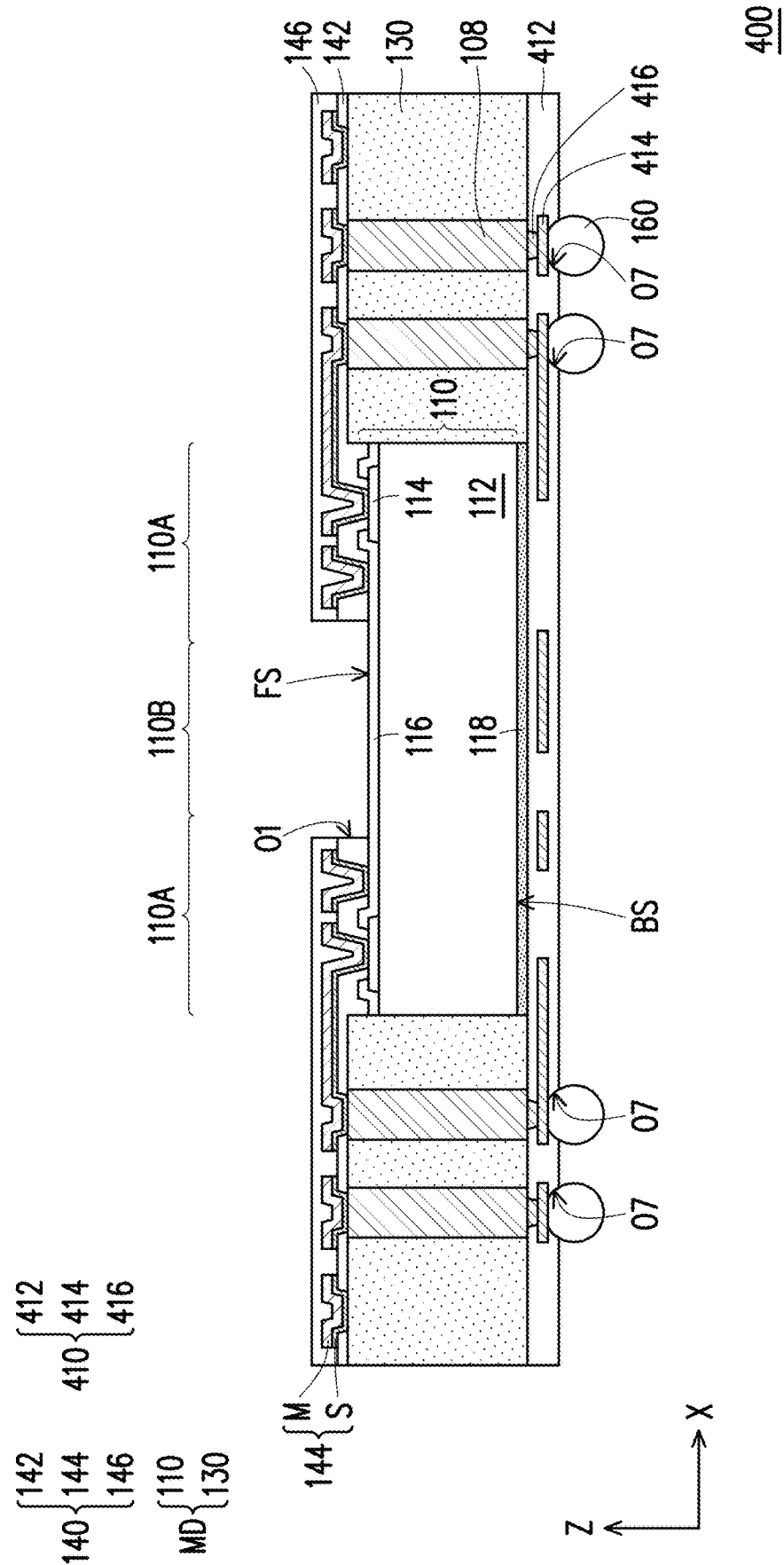
FIG. 17 is a schematic cross sectional view illustrating a semiconductor package in accordance with some alternative embodiments of the disclosure.

FIG. 17 is a schematic cross sectional view illustrating a semiconductor package 400 in accordance with some alternative embodiments of the disclosure. The semiconductor package 400 illustrated in FIG. 17 is similar to the semiconductor package 100 illustrated in FIG. 12, hence the same reference numerals are used to refer to the same or liked parts, and its detailed description will be omitted herein. The differences between the semiconductor package 400 and the semiconductor package 100 will be described below.

Referring to FIG. 17, another redistribution structure 410 is included in the semiconductor package 400. In detail, as shown in FIG. 17, the redistribution structure 410 and the redistribution structure 140 are respectively disposed on two opposite sides of the molded semiconductor device MD. Namely, the integrated circuit die 110 is sandwiched between the redistribution structure 410 and the redistribution structure 140. In other words, the integrated circuit die 110 and the encapsulant 130 are disposed on the redistribution structure 410, and the redistribution structure 140 is disposed on the integrated circuit die 110 and the encapsulant 130. In some embodiments, the front surface FS (i.e., the active surface) of the integrated circuit die 110 faces away from the redistribution structure 410, and the back surface BS of the integrated circuit die 110 faces toward the redistribution structure 410.

In some embodiments, the redistribution structure 410 includes a dielectric layer 412, a redistribution conductive layer 414, and conductive vias 416. In some embodiments, the redistribution conductive layer 414 includes contact pads and trace lines (such as routing traces or fan-out traces). For simplicity, the dielectric layer 412 is illustrated as one single layer of dielectric layer and the redistribution conductive layer 414 is illustrated as embedded in the dielectric layer 412 in FIG. 17. Nevertheless, from the perspective of the manufacturing process, the dielectric layer 412 is constituted by two dielectric layers and the redistribution conductive layer 414 is sandwiched between the two adjacent dielectric layers. As illustrated in FIG. 17, the conductive vias 416 are also embedded in the dielectric layer 412. Nevertheless, the illustrated top surfaces of the conductive vias 416 are exposed for the electrical connection to the conductive vias 108. That is to say, the conductive vias 108 extending through the molded semiconductor device MD are electrically connected with the redistribution structure 410 and the redistribution structure 140. To be more specific, both ends of the conductive vias 108 exposed from the encapsulant 130 of the molded semiconductor device MD are electrically connected with the redistribution structure 410 and the redistribution structure 140. Further, the locations of the conductive vias 416 of the redistribution structure 410 may be substantially aligned with or at least overlapped with the locations of the conductive vias 108.

The dielectric layer 412 in the redistribution structure 410 may be formed in a manner similar to the dielectric layer 142 in the redistribution structure 140, and may be formed of the same material as the dielectric layer 142 in the redistribution structure 140. Also, the redistribution conductive layer 414 and the conductive vias 416 in the redistribution structure 410 may be formed in a manner similar to the conductive layer 144 in the redistribution structure 140, and may be formed of the same material as the conductive layer 144 in the redistribution structure 140. Therefore, the detailed descriptions (e.g. the materials, formation processes) of the dielectric layer 412, the redistribution conductive layer 414 and the conductive vias 416 will be omitted herein. Further, although not shown, those skilled in the art can understand that the redistribution conductive layer 414 and the conductive vias 416 each may have a seed layer and a metal layer disposed on the seed layer as described with reference to FIG. 7.

It should be noted that the number of the redistribution conductive layer 414 and the number of the dielectric layer 412 illustrated in FIG. 17 are merely for illustrative purposes, and the disclosure is not limited thereto. In some alternative embodiments, more layers of the redistribution conductive layer and more layers of the dielectric layer may be formed depending on the circuit design. When more layers of redistribution conductive layer and more layers of the dielectric layer are adapted, these redistribution conductive layers and these dielectric layers are stacked alternately, and the redistribution conductive layers are interconnected with one another by the conductive vias. In some embodiments, the redistribution structure 410 is referred to as a back-side redistribution structure.

In some embodiments, as shown in FIG. 17, the conductive connectors 160 are physically and electrically connected with the redistribution conductive layer 414 through contact openings O7 formed in the dielectric layer 412. The contact openings O7 may be formed, for example, using a laser drilling process, a mechanical drilling process, a photolithography process, or other suitable processes. In some embodiments, when the redistribution structure 410 includes multiple redistribution conductive layers, the contact openings O7 expose the bottommost redistribution conductive layer.

In such embodiment of FIG. 17, the integrated circuit die 110 may be a die with a large footprint, such as a system-on-chip (SoC) device. In embodiments where the integrated circuit die 110 has a large footprint, the space available for the conductive vias 108 in each package region may be limited. As such, use of the redistribution structure 410 (i.e., the back-side redistribution structure) allows for an improved interconnect arrangement when the package region has limited space available for the conductive vias 108.

According to some embodiments, a semiconductor package includes a molded semiconductor device, a first redistribution structure and conductive vias. The molded semiconductor comprises a sensor die, wherein the sensor die has a first surface and a second surface opposite the first surface, the sensor die has an input/output region and a sensing region at the first surface. The first redistribution structure is disposed on the first surface of the sensor die, wherein the first redistribution structure covers the input/output region of the sensor die and exposes the sensing region of the sensor die, and the first redistribution structure comprises a conductive layer having a redistribution pattern and a ring structure. The redistribution pattern is electrically connected with the sensor die. The ring structure surrounds the sensing region of sensor die and is separated from the redistribution pattern, wherein the ring structure is closer to the sensing region than the redistribution pattern. The conductive vias extend through the molded semiconductor device and are electrically connected with the redistribution pattern.

According to some embodiments, a semiconductor package includes a sensor die, an encapsulant, conductive vias, and a first redistribution structure. The sensor die has a first surface and a second surface opposite the first surface, and the sensor die has a sensing region at the first surface. The encapsulant at least laterally encapsulates the sensor die. The conductive vias penetrate through the encapsulant. The first redistribution structure is disposed on the encapsulant and the first surface of the sensor die, and electrically connected with the sensor die and the conductive vias, wherein the first redistribution structure comprises a first dielectric layer, a second dielectric layer and a ring structure. The first dielectric layer and the second dielectric layer are disposed on the first dielectric layer, and the first dielectric layer and the second dielectric layer define an opening exposing the sensing region of the sensor die. The ring structure is sandwiched between the first dielectric layer and the second dielectric layer, extends through the first dielectric layer to be in contact with the first surface of the sensor die, and surrounds the opening.

According to some embodiments, a manufacturing process for a semiconductor package includes the following steps. A carrier is provided. Conductive vias are formed on the carrier. A sensor die is placed adjacent to the conductive vias, wherein the sensor die has an input/output region and a sensing region. The sensor die and the conductive vias are encapsulated with an encapsulant. A first redistribution structure is formed on the sensor die, the conductive vias and the encapsulant, wherein the first redistribution structure covers the input/output region and exposes the sensing region. The formation of the first redistribution structure includes forming a conductive layer with redistribution pattern electrically connected with the sensor die and the conductive vias, and a ring structure contacting the sensor die, surrounding the sensing region and electrically insulated from the redistribution pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
    a molded semiconductor device comprising a sensor die, wherein the sensor die has a sensing region at a front surface; and
    a first redistribution structure disposed on the front surface of the sensor die, wherein the first redistribution structure exposes the sensing region of the sensor die, and the first redistribution structure comprises a conductive layer having:
        a redistribution pattern electrically connected with the sensor die; and
        a ring structure surrounding the sensing region of sensor die, wherein the ring structure is disposed between the sensing region and the redistribution pattern, and the ring structure is electrically insulated from the sensor die.

2. The semiconductor package as claimed in claim 1, wherein the ring structure is located at the same level as the redistribution pattern.

3. The semiconductor package as claimed in claim 1, wherein the sensor die comprises:
    a substrate;
    pads disposed on the substrate, wherein the pads are electrically connected with the redistribution pattern; and
    a passivation film disposed on the pads and the substrate.

4. The semiconductor package as claimed in claim 3, wherein the ring structure contacts the passivation film.

5. The semiconductor package as claimed in claim 1, further comprising:
    conductive vias embedded in the molded semiconductor device and electrically connected with the redistribution pattern; and
    a second redistribution structure disposed on the sensor die and opposite to the first redistribution structure, wherein the second redistribution structure is electrically connected with the conductive vias.

6. The semiconductor package as claimed in claim 1, wherein the conductive layer further comprises:
    a seal ring disposed on the molded semiconductor device, wherein the seal ring surrounds the redistribution pattern and the ring structure and is electrically isolated from the redistribution pattern and the ring structure.

7. A semiconductor package, comprising:
    a sensor die having a sensing region at a front surface;
    an encapsulant at least laterally encapsulating the sensor die; and
    a first redistribution structure disposed on the encapsulant and the front surface of the sensor die, and electrically connected with the sensor die, wherein the first redistribution structure comprises:
        a first dielectric layer and a second dielectric layer disposed on the first dielectric layer, wherein the first dielectric layer and the second dielectric layer define an opening exposing the sensing region of the sensor die; and
        a ring structure sandwiched between the first dielectric layer and the second dielectric layer, extending through the first dielectric layer to be in contact with the front surface of the sensor die, surrounding the opening, and being electrically insulated from the sensor die.

8. The semiconductor package as claimed in claim 7, wherein the first redistribution structure further comprises:
    a redistribution pattern sandwiched between the first dielectric layer and the second dielectric layer, electrically connected with the sensor die, and electrically insulated from the ring structure.

9. The semiconductor package as claimed in claim 8, wherein the sensor die comprises:
    a substrate;
    pads disposed on the substrate, wherein the pads are electrically connected with the redistribution pattern; and
    a passivation film disposed on the pads and the substrate, and exposing portions of the pads.

10. The semiconductor package as claimed in claim 9, wherein the ring structure is located between the opening and each of the pads.

11. The semiconductor package as claimed in claim 9, wherein a topmost surface of the passivation film is below a topmost surface of the encapsulant.

12. The semiconductor package as claimed in claim 9, wherein a topmost surface of the passivation film is above a topmost surface of the encapsulant.

13. The semiconductor package as claimed in claim 9, wherein the ring structure is in contact with the passivation film.

14. The semiconductor package as claimed in claim 7, further comprising:
    conductive vias embedded in the encapsulant; and
    a second redistribution structure disposed on the sensor die and opposite to the first redistribution structure, wherein the second redistribution structure is electrically connected with the conductive vias.

15. The semiconductor package as claimed in claim 7, wherein the first redistribution structure further comprises:
    a seal ring disposed on the encapsulant, wherein the seal ring is sandwiched between the first dielectric layer and the second dielectric layer, surrounds the ring structure and is electrically insulated from the ring structure.

16. A manufacturing process for a semiconductor package, comprising:
    providing a carrier;
    placing a sensor die on the carrier, wherein the sensor die has a sensing region at a front surface;
    encapsulating the sensor die with an encapsulant to form a molded semiconductor device; and
    forming a first redistribution structure on the front surface of the sensor die and the encapsulant, wherein the first redistribution structure exposes the sensing region, and wherein forming the first redistribution structure comprises:
        forming a conductive layer with a redistribution pattern electrically connected with the sensor die, and a ring structure surrounding the sensing region, wherein the ring structure is disposed between the sensing region and the redistribution pattern, and the ring structure is electrically insulated from the sensor die.

17. The manufacturing process for the semiconductor package as claimed in claim 16, wherein the sensor die comprises:
    a substrate;
    pads disposed on the substrate, wherein the pads are electrically connected with the redistribution pattern; and
    a passivation film disposed on the pads and the substrate, and exposing portions of the pads.

18. The manufacturing process for the semiconductor package as claimed in claim 17, wherein encapsulating the sensor die comprises:
- forming the encapsulant by compression molding process; and
- planarizing the encapsulant such that top surface of the encapsulant is above a top surface of the substrate.

19. The manufacturing process for the semiconductor package as claimed in claim 17, wherein encapsulating the sensor die comprises:
- forming the encapsulant by transfer molding process such that a recess is formed in the encapsulant.

20. The manufacturing process for the semiconductor package as claimed in claim 17, wherein forming the first redistribution structure comprises:
- forming a first dielectric layer on the encapsulant and the sensor die;
- patterning the first dielectric layer with first openings exposing the portions of the pads, a second opening exposing the passivation film, and a third opening exposing the sensing region of the sensor die;
- forming the conductive layer extending through the first openings and the second opening of the first dielectric layer to from the redistribution pattern and the ring structure, wherein the third opening of the first dielectric layer is free from the conductive layer;
- forming a second dielectric layer on the conductive layer and the first dielectric layer; and
- extending the third opening through the second dielectric layer.

* * * * *